United States Patent
Choi et al.

(10) Patent No.: US 10,432,184 B1
(45) Date of Patent: Oct. 1, 2019

(54) CHANNEL SWITCHOVER POWER MULTIPLEXER CIRCUITS, AND METHODS OF OPERATING THE SAME

(71) Applicant: Texas Instruments Incorporated, Dallas, TX (US)

(72) Inventors: Jae Won Choi, Dallas, TX (US); Sungho Beck, Plano, TX (US); Richard Turkson, Princeton, TX (US); Johnny Klarenbeek, Dallas, TX (US); Bixia Li, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/217,658

(22) Filed: Dec. 12, 2018

Related U.S. Application Data

(60) Provisional application No. 62/716,686, filed on Aug. 9, 2018.

(51) Int. Cl.
*G11C 5/14* (2006.01)
*H03K 17/00* (2006.01)
*H03K 5/24* (2006.01)

(52) U.S. Cl.
CPC .............. *H03K 17/002* (2013.01); *H03K 5/24* (2013.01); *H03K 2217/0081* (2013.01)

(58) Field of Classification Search
CPC ......... G11C 5/147; G05F 1/465; G05F 3/205; G05F 3/262; H04B 1/1623; H03K 17/693; H03K 17/005; H03K 17/74; H03K 17/6257; H04J 3/047
USPC .......................................... 327/530, 407–408
See application file for complete search history.

(56) References Cited

U.S. PATENT DOCUMENTS

| | | | | |
|---|---|---|---|---|
| 4,812,672 A * | 3/1989 | Cowan | ..................... | H02J 9/061 307/43 |
| 6,462,434 B1 * | 10/2002 | Winick | ..................... | H02J 1/108 307/85 |
| 6,744,151 B2 * | 6/2004 | Jackson | ................... | H02J 1/108 307/113 |
| 8,981,839 B2 * | 3/2015 | Kay | ..................... | H03K 17/687 307/43 |

* cited by examiner

*Primary Examiner* — Anh Q Tra
(74) *Attorney, Agent, or Firm* — Tuenlap Chan; Charles A. Brill; Frank D. Cimino

(57) ABSTRACT

Channel switchover power multiplexer circuits, and methods of operating the same are disclosed. An example power multiplexer a first transistor coupled to a first input, a second transistor coupled to the first transistor to couple a first voltage at the first input to an output, a third transistor coupled to a second input, a fourth transistor coupled to the third transistor to couple a second voltage at the second input to the output, a diode amplifier to provide a third voltage to a gate of the first transistor to block a reverse current, and a soft-start amplifier to provide a fourth voltage to a gate of the fourth transistor to turn on (with adjustable VOUT ramp rate) the fourth transistor with a constant ramp rate.

19 Claims, 19 Drawing Sheets

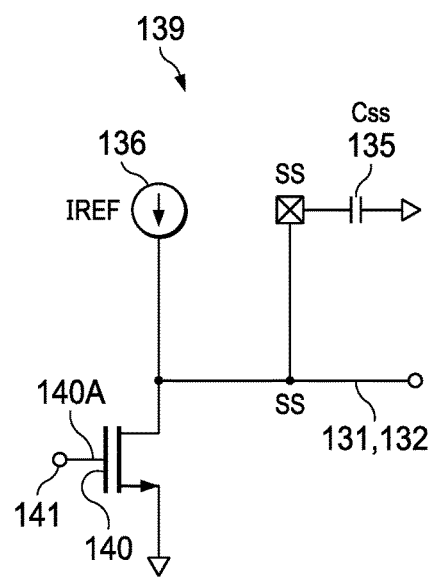
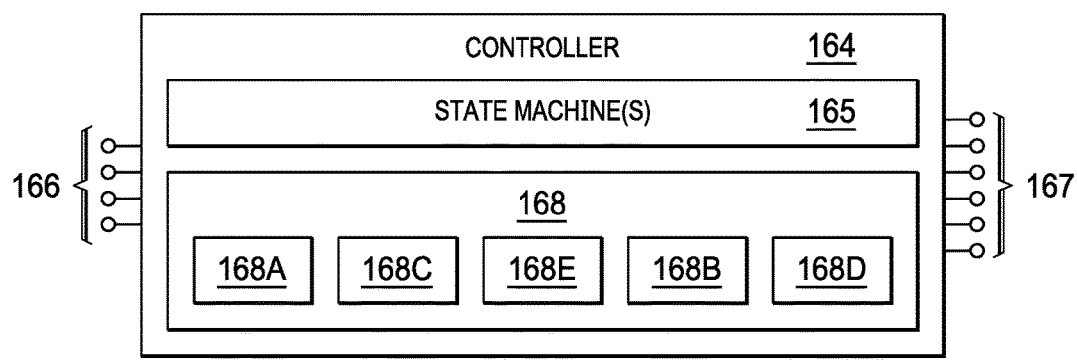
FIG. 5C

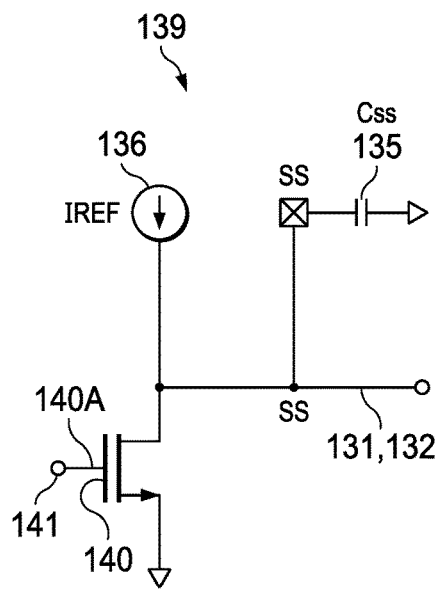
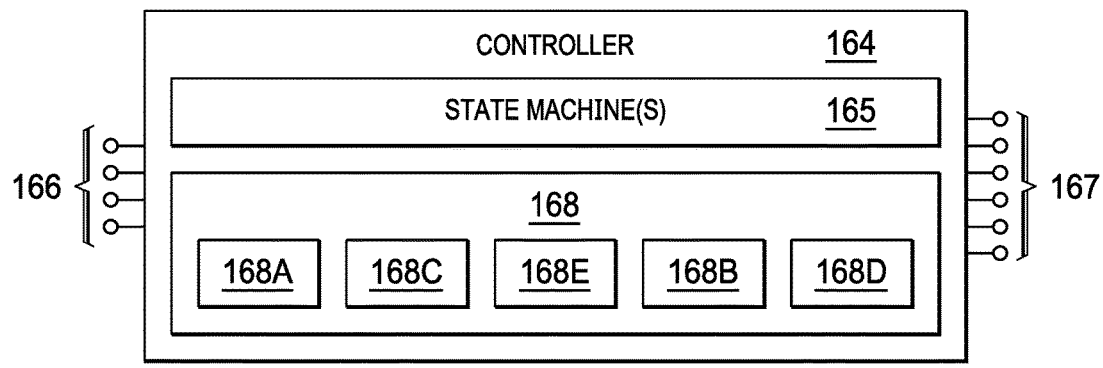
FIG. 6C

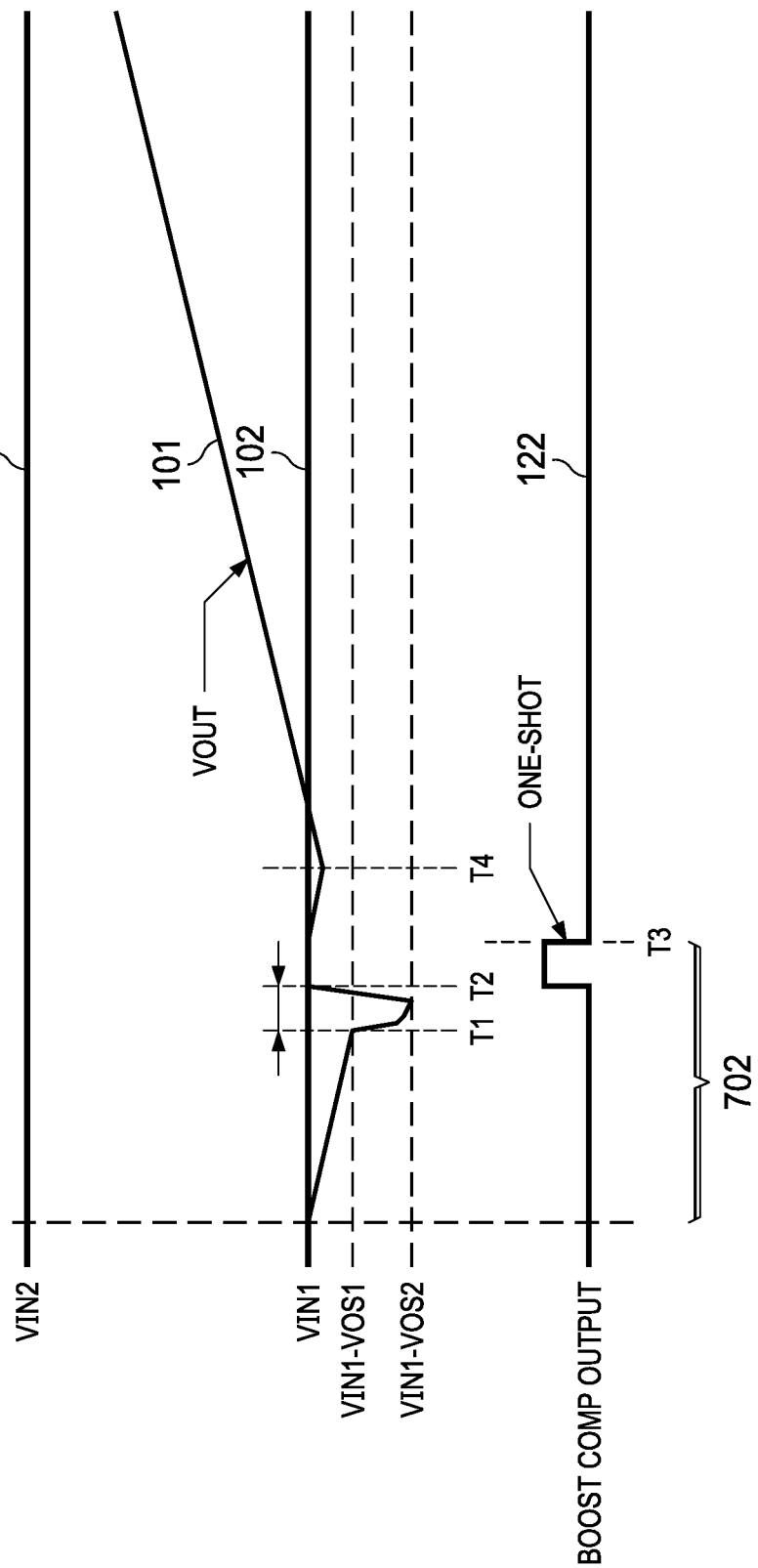

US 10,432,184 B1

CHANNEL SWITCHOVER POWER MULTIPLEXER CIRCUITS, AND METHODS OF OPERATING THE SAME

RELATED APPLICATION

This patent claims the benefit of U.S. Provisional Patent Application Ser. No. 62/716,686, which was filed on Aug. 9, 2018. U.S. Provisional Patent Application Ser. No. 62/716,686 is hereby incorporated herein by reference in its entirety.

FIELD OF THE DISCLOSURE

This disclosure relates generally to power multiplexers, and, more particularly, to channel switchover power multiplexer circuits, and methods of operating the same.

BACKGROUND

Power multiplexers are circuits, devices, etc. that switch between two or more input power supplies to provide a continuous output power supply.

BRIEF DESCRIPTION OF THE DRAWINGS

FIGS. 3A-C, 4A-C, 5A-C and 6A-C represents the power multiplexer circuit of FIGS. 1A-C in respective ones of the states of FIG. 2.

FIG. 7 is a graph illustrating an example switchover of the example power multiplexer circuit of FIGS. 1A-C.

Figure 1A:
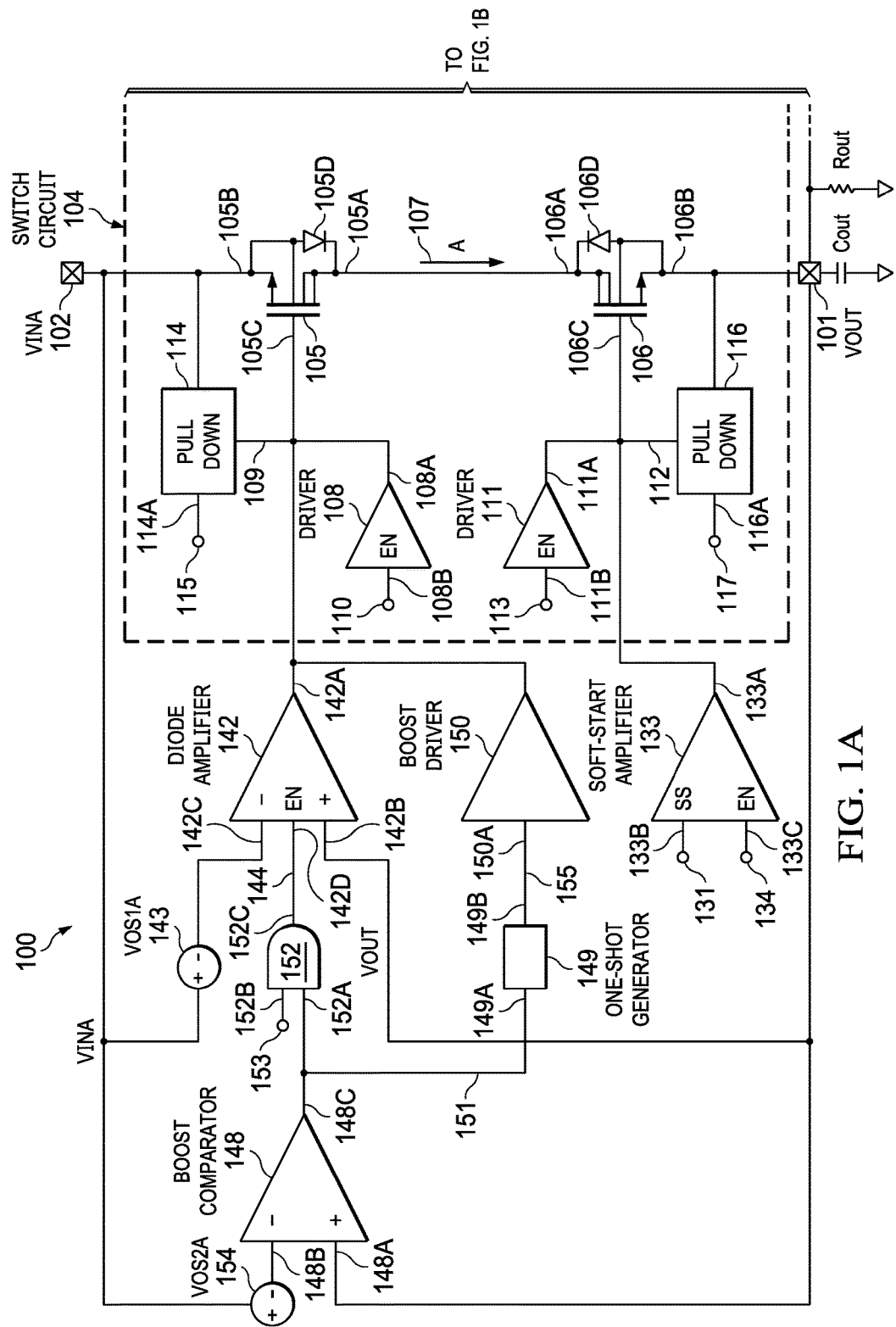
FIGS. 1A-C illustrate an example power multiplexer circuit constructed in accordance with aspects of the present disclosure.

In general, the same reference numbers will be used throughout the drawing(s) and accompanying written description to refer to the same or like parts. The figures are not to scale. Connecting lines or connectors shown in the various figures presented are intended to represent example functional relationships and/or physical or logical couplings between the various elements.

DETAILED DESCRIPTION

Some power multiplexers may demonstrate undesirable channel switchover behaviors when switching between input power supplies. For example, immediate switchovers between input power supplies can cause large inrush currents, large reverse currents that can cause circuit damage, poor load transients, instabilities due to load capacitance and/or resistance, output voltage dropout, etc.

Reference will now be made in detail to examples, some of which are illustrated in the accompanying drawings that improve the characteristics and/or capabilities of some power multiplexers. Advantageously, disclosed examples perform channel switchovers under a wide range of load conditions and without the undesirable channel switchover behavior.

Figure 1B:
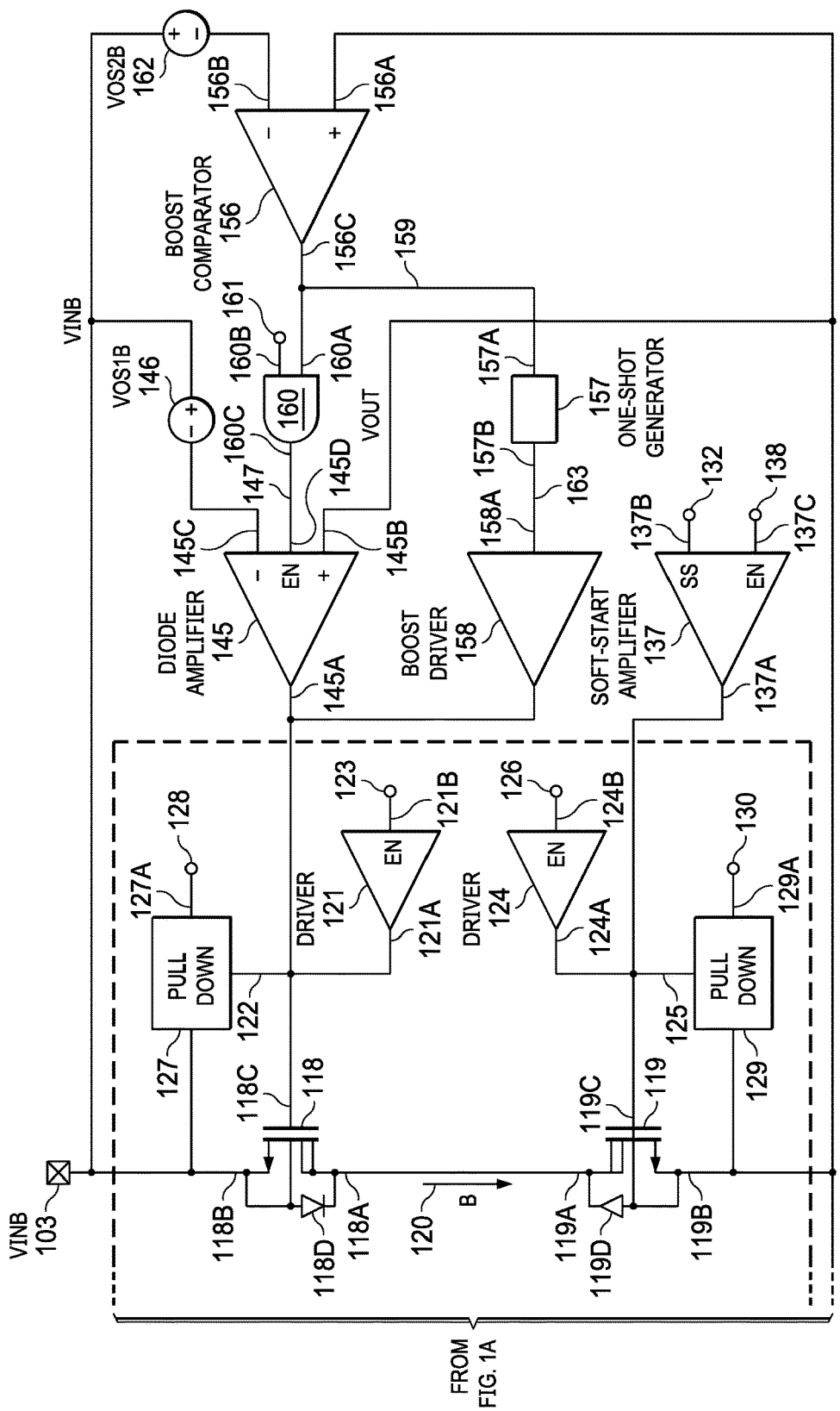
Figure 1C:
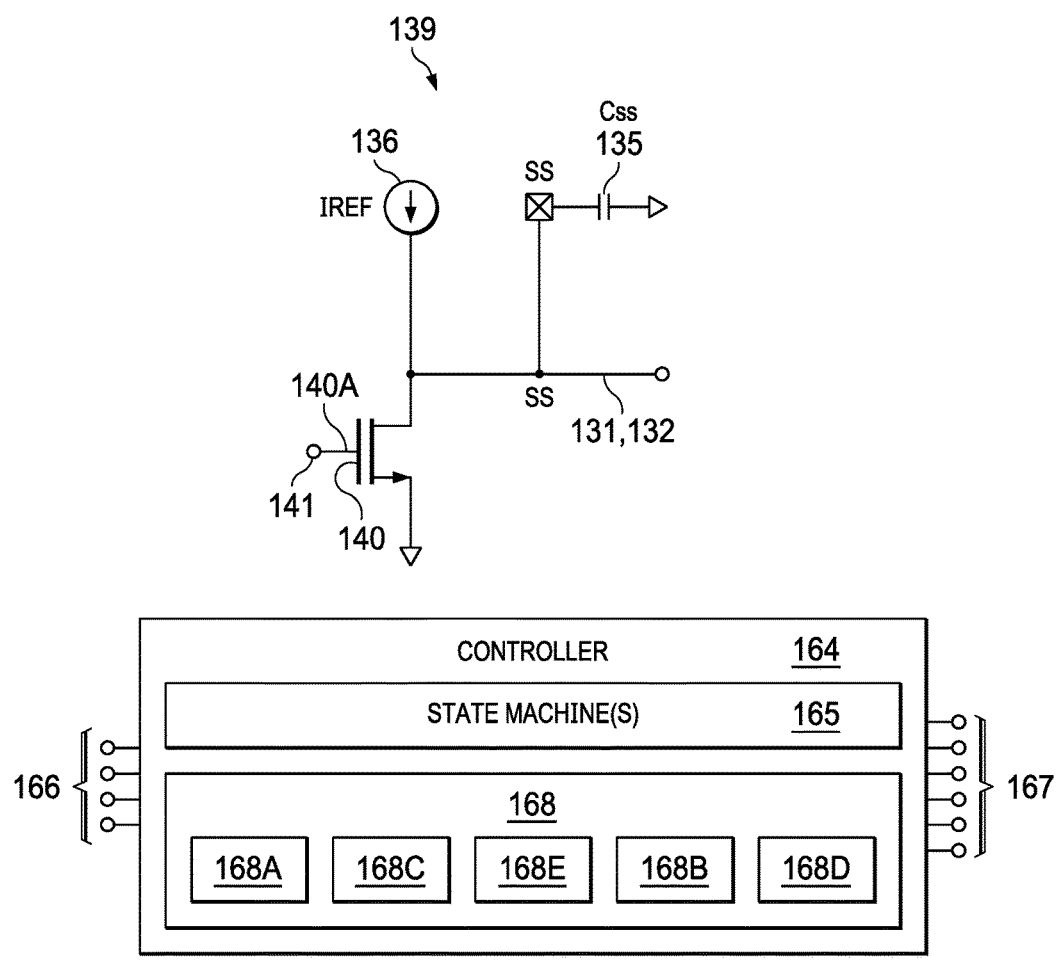

FIGS. 1A-C illustrates an example power multiplexer circuit 100 constructed in accordance with aspects of the present disclosure. To selectively switch an output 101 (e.g., a power multiplexer output) between a first input 102 (e.g., a first power multiplexer input) and a second input 103 (e.g., a second power multiplexer input), the example power multiplexer circuit 100 includes an example switch circuit 104. The example switch circuit 104 can be used, for example, to switch a power supply output between a first power supply input and a second power supply input.

To selectively couple a first input power supplied coupled the input 102 to the output 101 (e.g., under the control of a controller, state machine, etc.), the example switch circuit 104 includes an example first transistor (e.g., an n-channel metal-oxide semiconductor field-effect transistor (MOSFET) 105, a field-effect transistor (FET), a bipolar junction transistor (BJT), etc.), and an example second transistor (e.g., an n-channel MOSFET 106, a FET, a BJT, etc.). The example MOSFET 105 and the example MOSFET 106 are arranged in a back-to-back topology with their respective drains 105A and 106A connected. The source 105B of the MOSFET 105 is connected to the first input 102, and the source 106B of the MOSFET 106 is connected to the output 101. When both the MOSFET 105 and the MOSFET 106 are turned on, the input 102 is connected to the output 101, and current is able to pass back and forth between the input 102 and the output 101 through a first channel A 107 formed by the MOSFET 105 and the MOSFET 106. The MOSFET 105 has a body diode 105D, and the MOSFET 106 has a body diode 106D.

To turn on the MOSFET 105, the example switch circuit 104 includes an example driver 108. The example driver 108 outputs from an output 108A a gate voltage on a line 109 to a gate 105C of the MOSFET 105. The driver 108 turns on (e.g., closes) the MOSFET 105 when a logic HIGH voltage is provided on a line 110 to an enable input 108B of the driver 108. When the MOSFET 105 is closed, the drain 105A is coupled to the source 105B.

To turn on the MOSFET 106, the example switch circuit 104 includes an example driver 111. The example driver 111 outputs from an output 111A a gate voltage on a line 112 to a gate 106C of the MOSFET 106. The driver 111 turns on (e.g., closes) the MOSFET 106 when a logic HIGH voltage is provided on a line 113 to an enable input 111B of the driver 111. When the MOSFET 106 is closed, the drain 106A is coupled to the source 106B.

To turn off the MOSFET 105, the example switch circuit 104 includes an example pull-down 114. The example pull-down 114 pulls the gate voltage on the line 109 at the gate 105C of the MOSFET 105 to the input voltage VINA at the input 102 to turn off (e.g., open) the MOSFET 105 and uncouple the drain 105A from the source 105B when a logic HIGH gate voltage on a line 115 is provided to an enable input 114A of the pull-down 114.

To turn off the MOSFET 106, the example switch circuit 104 includes an example pull-down 116. The example pull-down 116 pulls the gate voltage on the line 112 at the gate 106C of the MOSFET 106 to the output voltage VOUT at the output 101 to turn off (e.g., open) the MOSFET 106 and uncouple the drain 106A from the source 106B when a logic HIGH gate voltage on a line 117 is provided to an enable input 116A of the pull-down 116.

In general, when one of the MOSFETs 105, 106, 118, 119 has been turned off via its gate voltage, its respective pull-down 114, 116, 127, 129 is enabled, thereby fully de-coupling its associated input 102, 103 from the output 101.

To selectively couple a second input power supply coupled to the input 103 to the output 101 (e.g., under the control of a controller, state machine, etc.), the example switch circuit 104 includes a third transistor (e.g., an n-channel MOSFET 118, a FET, a BJT, etc.) and a fourth transistor (e.g., an n-channel MOSFET 119, a FET, a BJT, etc.). The MOSFET 118 and the MOSFET 119 are arranged in a back-to-back topology with their respective drains 118A and 119A connected. The source 118B of the MOSFET 118 is connected to the second input 103, and the source 119B of the MOSFET 119 is connected to the output 101. When both the MOSFET 118 and the MOSFET 119 are turned on, the input 103 is connected to the output 101, and current is able to pass back and forth between the input 103 and the output 101 through a second channel B 120 formed by the MOSFET 118 and the MOSFET 119.

To turn on the MOSFET 118, the example switch circuit 104 includes an example driver 121. The example driver 121 outputs from an output 121A a gate voltage on a line 122 to a gate 118C of the MOSFET 118. The driver 121 turns on (e.g., closes) the MOSFET 118 when a logic HIGH voltage is provided on a line 123 to an enable input 121B of the driver 121. When the MOSFET 118 is closed, the drain 118A is coupled to the source 118B.

To turn on the MOSFET 119, the example switch circuit 104 includes an example driver 124. The example driver 124 outputs from an output 124A a gate voltage on a line 125 to a gate 119C of the MOSFET 119. The driver 124 turns on (e.g., closes) the MOSFET 119 when a logic HIGH voltage is provided on a line 126 to an enable input 124B of the driver 124. When the MOSFET 119 is closed, the drain 119A is coupled to the source 119B.

To turn off the MOSFET 118, the example switch circuit 104 includes an example pull-down 127. The example pull-down 127 pulls the gate voltage on the line 122 at the gate 118C of the MOSFET 118 to the input voltage VINB at the input 103 to turn off (e.g., open) the MOSFET 118 and uncouple the drain 118A from the source 118B when a logic HIGH gate voltage on a line 128 is provided on an enable input 127A of the pull-down 127.

To turn off the MOSFET 119, the example switch circuit 104 includes an example pull-down 129. The example pull-down 129 pulls the gate voltage on the line 125 at the gate 119C of the MOSFET 119 to the output voltage VOUT at the output 101 to turn off (e.g., open) the MOSFET 119 and uncouple the input 103 from the output 101 when a logic HIGH gate voltage on a line 130 is provided on an enable input 129A of the pull-down 129.

Due to parasitic capacitive coupling to the gates 105C, 106C of the MOSFETS 105, 106, when an input voltage VINA at the input 102 is too quickly coupled to the output 101 by turning on the MOSFETS 105, 106, a large inrush current from the input 102 being switched into the associated MOSFETS 105, 106 can occur. The MOSFETs 105, 106 pass inrush current through respective channels. For example, MOSFET 105 inrush current can flow through a body diode 105D if parasitic capacitive coupling was not able to turn on MOSFET 105. To remove inrush current from the input 102 to the MOSFETS 105, 106 due to parasitic coupling, the example pull-down 114 is enabled to discharge the gate 105C to the input 102 keeping the MOSFET 105 turned off, and the pull-down 116 is enabled to discharge the gate 106C to the output 101 keeping the MOSFET 106 is turned off. Likewise, to reduce inrush current from the input 103 to the MOSFETS 118, 119 due to parasitic coupling, the example pull-down 127 is enabled to discharge the gate 118C to the input 103 keeping the MOSFET 118 turned off, and the pull-down 129 is enabled to discharge the gate 119C to the output 101 keeping the MOSFET 119 turned off.

In some examples, the pull-downs 114, 116, 127 and 129 are controlled based on soft-start voltages on lines 131, 132 (discussed below). For example, while a soft-start voltage on a line 131, 132 satisfies a threshold (e.g., is below a reference voltage), a logic HIGH enable voltage is provided at the respective enable inputs 114A, 116A, 127A, and 129A of the pull-downs 114, 116, 127, and 129 to close the pull-downs 114, 116, 127, and 129, thereby opening the MOSFETs 105, 106, 118 and 119, and reducing the effects of parasitic capacitive coupling.

With fixed output voltage VOUT ramp rate (dVout/dt) by the driver 111 and the driver 124, a large inrush current can be generated by large output capacitance Cout conditions. Inrush current can be mathematically expressed as Cout*dVout/dt. To support a large output capacitance Cout with a small inrush current, the example power multiplexer circuit 100 includes an example soft-start amplifier 133, which enables an adjustable VOUT ramp rate. An output 133A of the example soft-start amplifier 133 is connected to the gate 106C of the MOSFET 106 via the line 112. The soft-start amplifier 133 drives the gate voltage on the line 112 at the gate 106C in response to a soft-start voltage on a line 131 at an input 133B. The soft-start amplifier 133 is enabled when an enable voltage on a line 134 at an input 133C is a logic HIGH voltage. The soft-start voltage on the line 131 at the input 133B increases gradually over time (e.g., with, according to, etc. a constant or steady ramp rate), thereby the voltage on the output 133A increases gradually over time (e.g., with, according to, etc. a constant or steady ramp rate) to control the rise time of the output 101 to manage inrush current. For example, the soft-start voltage on the line 131 at the input 133B can increase at a constant ramp rate of IREF/Css, thereby causing the voltage on the output 133A to increase at a constant ramp rate of ramp_rate=(IREF/Css)*gain, where Css is the external capacitor 135,
gain is the gain of the soft-start amplifier 133, and
IREF is the current output of a reference current source 136.

In general, the external capacitor Css 135 can be selected to control a VOUT ramp rate that satisfies application requirements (e.g., anticipated load conditions, output capacitance Cout conditions, turn-on time objectives, inrush current limits, etc.). For example, under large output capacitance Cout conditions, a large exterior capacitor Css 135 can be used to form a slow VOUT ramp rate, thereby preventing a large inrush current that could damage the device or drop the power supply VIN (e.g., a system reset). However, too slow of a VOUT ramp rate may not be suitable for applications benefiting from a faster power-up to meet power-up sequence timing requirement. In some examples, the soft-start amplifier 133 is controlled based the soft-start voltage on the line 131. For example, when the soft-start voltage on the line 131 no longer satisfies the threshold (e.g., is equal to or greater than the reference voltage), a logic LOW enable voltage is provided at the enable inputs 114A and 116A of the pull-downs 114 and 116 to open the pull-downs 114 and 116, and a logic HIGH enable voltage on the line 134 is provided at the input 133C to enable the soft-start amplifier 133 to close the MOSFET 106 with an adjustable output ramp rate of (IREF/Css)*gain. In some examples, with a small output capacitance COUT, a fixed charging current driver may be used instead of the soft-start amplifier 133. In some examples, the reference voltage VREF is selected based on soft-start amplifier headroom.

To maintain a small inrush current under large output capacitance Cout conditions, the example power multiplexer circuit 100 includes an example soft-start amplifier 137, which enables an adjustable VOUT ramp rate. An output 137A of the example soft-start amplifier 137 is connected to the gate 119C of the MOSFET 119 via the line 125. The soft-start amplifier 137 drives the gate voltage on the line 125 at the gate 119C in response to a soft-start voltage on a line 132 at an input 137B. The soft-start amplifier 137 is enabled when an enable voltage on a line 138 at an input 137C is a logic HIGH voltage. The soft-start voltage on the line 132 increases with a constant ramp rate, thereby the voltage on the output 137A increases with a constant ramp rate to control the rise time of the voltage VOUT at the output 101, thereby managing inrush current. For example, the soft-start voltage on the line 132 at the input 137B can increase at a constant ramp rate of IREF/Css, thereby causing the voltage on the output 137A to increase at a constant ramp rate of $$\text{ramp\_rate} = (IREF/Css) * \text{gain, where}$$

Css is the external capacitor 135,
gain is the gain of the soft-start amplifier 137, and
IREF is the current output of a reference current source 136.

In general, the external capacitor Css 135 can be selected to control a VOUT ramp rate that satisfies application requirements (e.g., anticipated load conditions, output capacitance Cout conditions, turn-on time objectives, inrush current limits, etc.). For example, under large output capacitance Cout conditions, a large exterior capacitor Css 135 can be used to form a slow VOUT ramp rate, thereby preventing a large inrush current that could damage the device or drop the power supply VIN (e.g., a system reset). However, too slow of a VOUT ramp rate may not be suitable for applications benefiting from a faster power-up to meet power-up sequence timing requirement. In some examples, the soft-start amplifier 137 is controlled based the soft-start voltage. For example, when the soft-start voltage on the line 132 no longer satisfies the threshold (e.g., is equal to or greater than the reference voltage), a logic LOW enable voltage is provided at the enable inputs 127A and 129A of the pull-downs 127 and 129 to open the pull-downs 127 and 129, and a logic HIGH enable voltage on the line 138 is provided at the input 137C to enable the soft-start amplifier 137 to close the MOSFET 119 with an adjustable output ramp rate of (IREF/Css)*gain. In some examples with a small output capacitance COUT, a fixed charging current driver may be used instead of the soft-start amplifier 137. In some examples, the reference voltage VREF is selected based on soft-start amplifier headroom.

Any number and/or type(s) of sources, generators, etc. can be used to generate the soft-start voltages on the lines 131, 132. For example, an example generator 139 includes the external capacitor 135 having a terminal coupled to a charging source (e.g., the reference current source 136) and the lines 131, 132. The external capacitor 135 is charged by the reference current source 136, and discharged to form either or both of the soft-start voltages on the lines 131, 132. In some examples, the gate 106C of the MOSFET 106 and the gate 119C of the MOSFET 119 have their own external capacitor 135. In some examples, the external capacitor 135 is shared by both channels, and discharged by a gate 140 before or as part of each channel switchover. The external capacitor 135 is discharged by controlling a gate voltage on a line 141 on a gate 140A of the gate 140.

To prevent (e.g., reduce, block, restrict, etc.) (a) a dip in an output voltage VOUT at the output 101 that may occur when the first channel A 107 is turned off before the second channel B 120 is turned on, and/or (b) a reverse current (e.g., current flowing from the input 102, 103 to the opposite input 103, 102) that may occur when the second channel B 120 is turned on before the first channel A 107 is turned off, the example power multiplexer circuit 100 of FIGS. 1A-C includes an example diode amplifier 142. An output 142A of the example diode amplifier 142 is connected to the gate 105C of the MOSFET 105. The example diode amplifier 142 controls the gate voltage on the line 109 at the gate 105C to regulate an output voltage VOUT at an input 142B to be a voltage VINA-VOS1A at an input 142C. VOS1A is a voltage (e.g., 40 milliVolts (mV)) across a voltage source 143. Under some load conditions, the diode amplifier 142 may become unstable. Accordingly, in some examples, the diode amplifier 142 is only enabled during channel switchover operations. An enable input voltage on a line 144 received on an enable input 142D can be controlled to disable and enable the diode amplifier 142.

To prevent (e.g., reduce, block, restrict, etc.) (a) a dip in the output voltage VOUT at the output 101 that may occur when the first channel B 120 is turned off before the second channel A 107 is turned on, and/or (b) a reverse current (e.g., current flowing from the input 103 to the input 102) that may occur when the second channel A 107 is turned on before the first channel B 120 is turned off, the example power multiplexer circuit 100 of FIGS. 1A-C includes an example diode amplifier 145. An output 145A of the example diode amplifier 145 is connected to the gate 118C of the MOSFET 118. The example diode amplifier 145 regulates the gate voltage on the line 122 at the gate 118C to regulate the output voltage VOUT at an input 145B to be a voltage VINB-VOS1B at an input 145C. VOS1B is a voltage (e.g., 40 mV) across a voltage source 146. Under some load conditions, the diode amplifier 145 may become unstable. Accordingly, in some examples, the diode amplifier 145 is only enabled during channel switchover operations. An enable input voltage on a line 147 received on an enable input 145D can be controlled to disable and enable the diode amplifier 145.

To, if necessary, stabilize the example diode amplifier 142, the example power multiplexer circuit 100 of FIGS. 1A-C includes an example boost comparator 148, a pulse generator (e.g., an example one-shot generator 149) and an example boost driver 150. When the output voltage VOUT at an input 148A falls below a voltage VINA-VOS2A at an input 148B (e.g., signifying a potentially unstable diode amplifier 142 or VOUT drop because VOS2>VOS1), the example boost comparator 148 outputs a logic LOW voltage on a line 151 at an output 148C. A logic gate (e.g., an AND gate 152) computes a logic AND of the voltage on the line 151 at an input 152A and an enable voltage on a line 153 at an input 152B. The logic LOW voltage on the line 151 causes the enable voltage on the line 144 to become a logic LOW voltage, thereby disabling the diode amplifier 142. VOS2A is a voltage across a voltage source 154 that, in some examples, is greater than VOS1A.

The logic LOW voltage on the line 151 at an input 149A of the one-shot generator 149 causes the one-shot generator 149 to form a pulse 155 (e.g., 5 microseconds long) on an output 149B. The pulse 155 at an input 149A of the example boost driver 150 causes the boost driver 150 to output a pulsed gate voltage on the line 109, thereby turning on the MOSFET 105 for a period of time. For example, 5 microseconds, which is selected to be the time required to increase VOUT to be greater than VIN−VOS1 (VOUT>VIN−VOS1), thereby stabilizing the diode amplifier 142. For example, when VOUT>VIN−VOS1, the diode amplifier 142 turns off the MOSFET 105, so the diode amplifier 142 cannot regulate VOUT to exceed VIN−VOS1 for stability. Instead, VOUT needs to be discharged to below VIN−VOS1 to enable the diode amplifier 142 feedback loop to be engaged again, thereby turning on the MOSFET 105. If the diode amplifier 142 is unstable again, or VOUT drops due to a load-transient, then boost comparator 148 trips, and this cycle is repeated until the other channel's soft-start amplifier 137 controls the output voltage VOUT and increases VOUT to be greater than VIN−VOS1 (the diode amplifier 142 loop cut-off). When, the output voltage VOUT at the output 101 rises above the voltage VINA-VOS2A, the example boost comparator 148 outputs a logic HIGH voltage on a line 151 from the output 148C, which causes the output 152C of the AND gate 152 to become a logic HIGH voltage on the line 144, thereby re-enabling the diode amplifier 142.

To, if necessary, stabilize the example diode amplifier 145, the example power multiplexer circuit 100 of FIGS. 1A-C includes an example boost comparator 156, a pulse generator (e.g., an example one-shot generator 157) and an example boost driver 158. When the output voltage VOUT at an input 156A falls below a voltage VINB-VOS2B at an input 156B (e.g., signifying a potentially unstable diode amplifier 145 or VOUT drop), the example boost comparator 156 outputs a logic LOW voltage on a line 159 from an output 156C. A logic gate (e.g., an AND gate 160) computes a logic AND of the voltage on the line 159 at an input 159A and an enable voltage on a line 161 at an input 160B. The logic LOW voltage on the line 159 causes the enable voltage on the line 147 to become a logic LOW voltage, thereby, disabling the diode amplifier 145. VOS2B is a voltage across a voltage source 162.

The logic LOW voltage on the line 159 at an input 157A of the example one-shot generator 157 causes the one-shot generator 157 to form a pulse (e.g., 5 microseconds long) on a line 163 from an output 157B. The pulse on the line 163 at an input 158A of the example boost driver 158 causes the boost driver 158 to output a pulsed gate voltage on the line 122, thereby turning on the MOSFET 118 for, for example, 5 microseconds, thereby stabilizing the diode amplifier 145. When, the output voltage VOUT at the output 101 rises above the voltage VINA-VOS2B, the example boost comparator 156 outputs a logic HIGH voltage on the line 159 from the output 156C, which causes the output 160C of the AND gate 160 to become a logic HIGH voltage, thereby re-enabling the diode amplifier 145.

To control operations, the example power multiplexer circuit 100 of FIGS. 1A-C includes an example controller 164. The example controller 164 implements one or more state machines 165 to, at least, control the operations of the devices of FIGS. 1A-C. The example controller 164 receives inputs 166 (e.g., voltages, etc.) and provides outputs or causes to be output voltages 167 (e.g., voltages on the lines 110, 113, 115, 117, 123, 126, 128, 130, 134, 138, 153, 161, etc.) to control the states of the power multiplexer circuit 100.

The example state machine(s) 165 may be implemented by, for example, hardware logic and/or machine-readable instructions stored on any number and/or type(s) of non-transitory computer-readable storage device or non-transitory storage disk such as a non-volatile memory (e.g., ready-only memory (ROM), electrically erasable programmable read-only memory (EEPROM), flash memory), a volatile memory (e.g., Synchronous Dynamic Random Access Memory (SDRAM), Dynamic Random Access Memory (DRAM), RAMBUS® Dynamic Random Access Memory (RDRAM®) and/or any other type of random access memory (RAM) device), etc. including the hardware logic and/or machine-readable instructions. The example controller 164 of FIGS. 1A-C may include, for example, one or more of a logic circuit, a programmable processor, a programmable controller, a digital signal processor (DSP), an application specific integrated circuit (ASIC), a programmable logic device (PLD), an Advanced RISC Machine (ARM) processor, a field programmable logic device (FPLD), etc.

The example controller 164 of the illustrated example includes memory 168 including local memory 168A (e.g., a cache), and main memory 168B including volatile memory 168C and/or non-volatile memory 168D via, for example, a bus. The volatile memory 168C may be implemented by SDRAM, DRAM, RDRAM and/or any other type of random access memory device. The non-volatile memory 168D may be implemented by flash memory and/or any other desired type of memory device. Access to the memory 168 is controlled by a memory controller (not shown).

Figure 2:
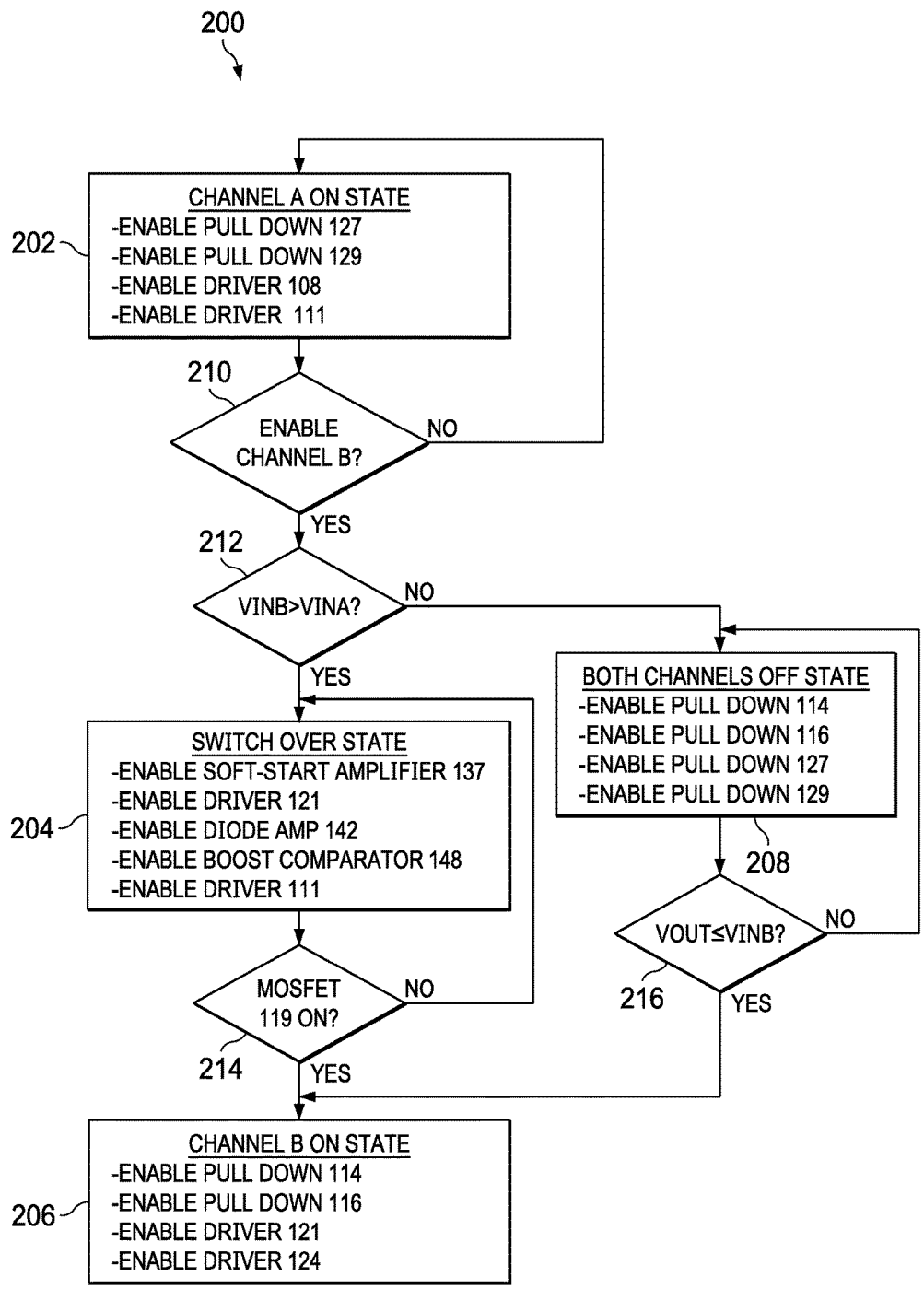
FIG. 2 illustrates an example state diagram representative of example hardware logic or machine-readable instructions for operating the power multiplexer circuit of FIGS. 1A-C.
Figure 8A:
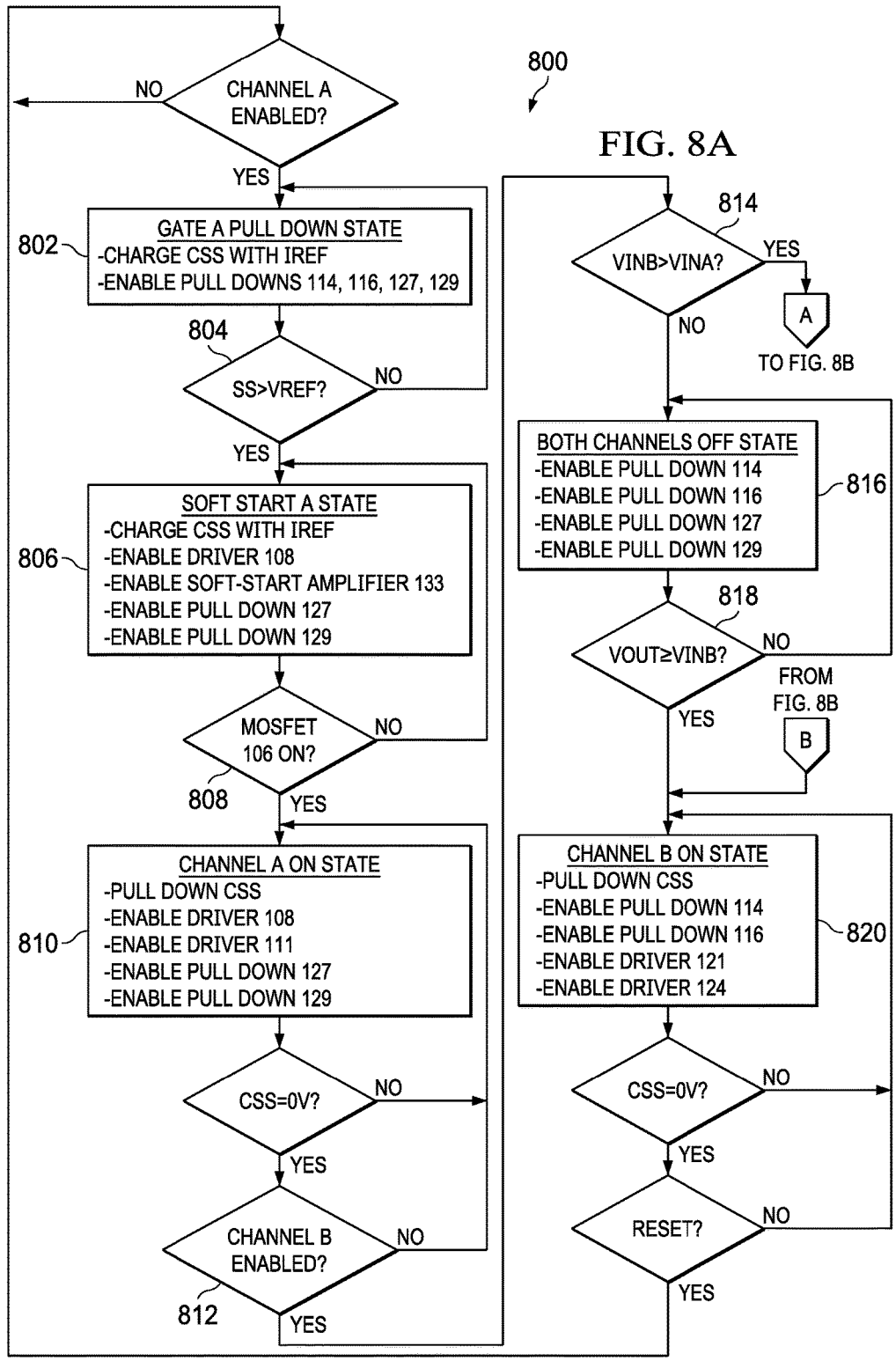
FIGS. 8A-B illustrates another example state diagram representative of example hardware logic or machine-readable instructions for operating the power multiplexer circuit of FIGS. 1A-C.
Figure 8B:
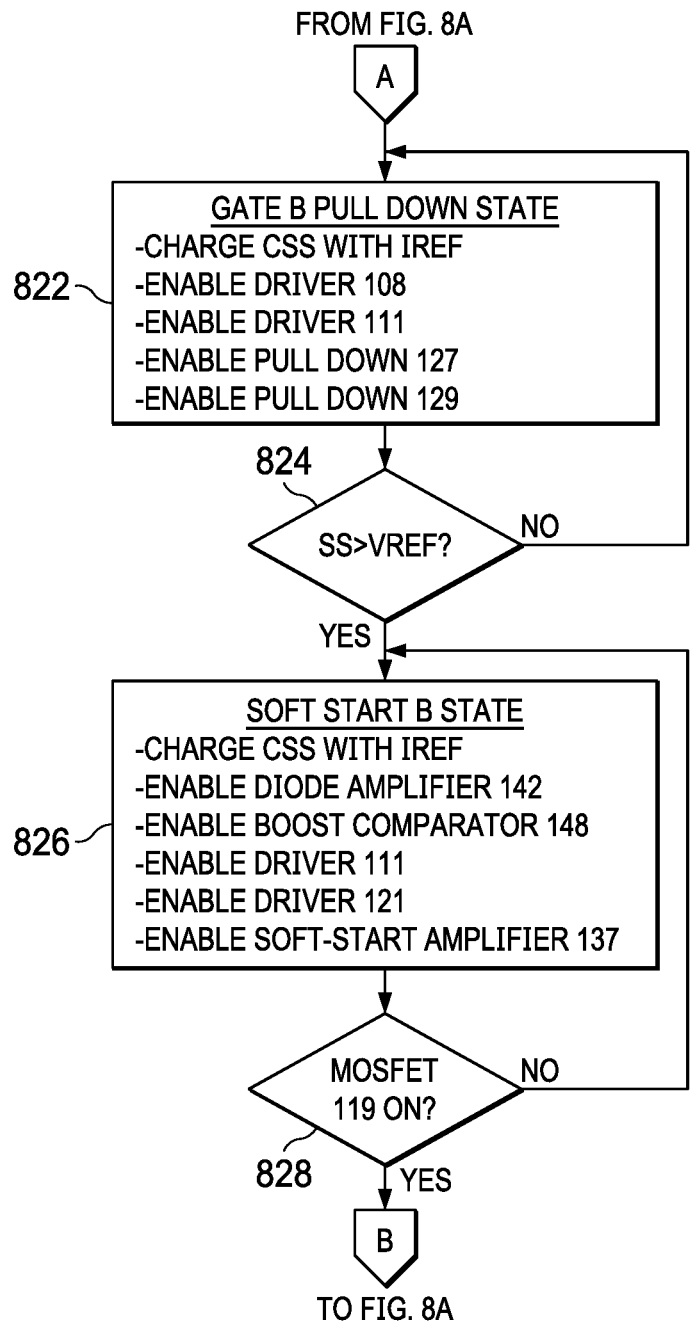

Coded instructions 168E including the state machines 165, and the coded instructions of FIG. 2 and FIGS. 8A-B may be stored in the main memory 168B, the volatile memory 168C, the non-volatile memory 168D, and/or on a removable non-transitory computer-readable storage medium such as a CD-ROM or a DVD.

While an example power multiplexer circuit 100 is illustrated in FIGS. 1A-C, one or more of the elements, processes, components and/or devices illustrated in FIGS. 1A-C may be combined, divided, re-arranged, omitted, eliminated and/or implemented in any other way. Further, the example power multiplexer circuit 100 of FIGS. 1A-C may include one or more elements, processes and/or devices in addition to, or instead of, those illustrated in FIGS. 1A-C, and/or may include more than one of any or all of the illustrated elements, processes and devices. For example, some switchover aspects of the power multiplexer may be omitted if not needed, wanted, etc. In some examples, communication, coupling, etc. is indirect through one or more intermediary components. In some examples, the intermediary components do not alter the signal or information integrity of the communication. Indirect communication does not require direct physical (e.g., wired) communication and/or constant communication.

FIG. 2 is a state diagram 200 representative of operations of an example state machine for operating the example power multiplexer circuit 100 of FIGS. 1A-C. A state machine to implement the state diagram 200 of FIG. 2 may be implemented as hardware logic, machine-readable instructions, hardware implemented state machines, and/or any combination thereof for operating the example power multiplexer circuit 100 of FIGS. 1A-C. The state diagram 200 may be an executable program or portion of an executable program for execution by a processor. The program may be embodied in software (e.g., machine-readable instructions) stored on any number and/or type(s) of non-transitory computer-readable storage device or non-transitory storage disk such as such as a non-volatile memory (e.g., ROM, EEPROM, flash memory), a volatile memory (e.g., SDRAM, DRAM, RDRAM® and/or any other type of RAM device), etc. including the hardware logic and/or machine-readable instructions.

The example processor may be, for example, one or more of a programmable processor, a programmable controller, a DSP, an ASIC, an ARM processor, etc. Additionally, and/or alternatively, the state diagram 200 may be implemented by one or more hardware circuits (e.g., discrete and/or integrated analog and/or digital circuitry, a PLD, an FPGA, an ASIC, a comparator, an operational-amplifier (op-amp), a logic circuit, etc.) structured to perform the corresponding operations without executing software or firmware. Although an example state machine is described with reference to the state diagram 200 illustrated in FIG. 2, many other methods of operating the power multiplexer circuit 100 may alternatively be used. For example, the order of execution of the states may be changed, and/or some of the states described may be changed, eliminated, or combined.

Figure 3A:
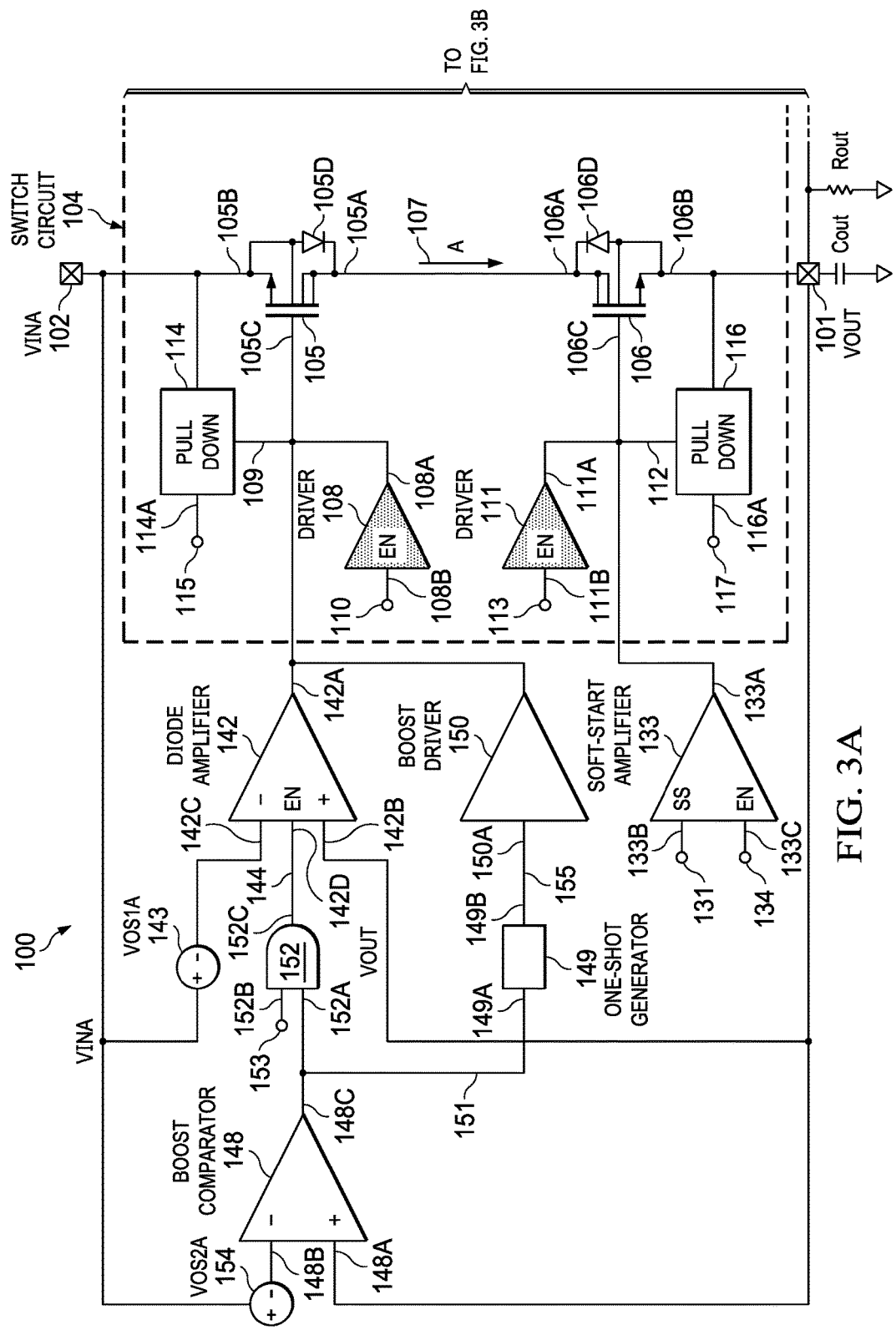
Figure 3B:
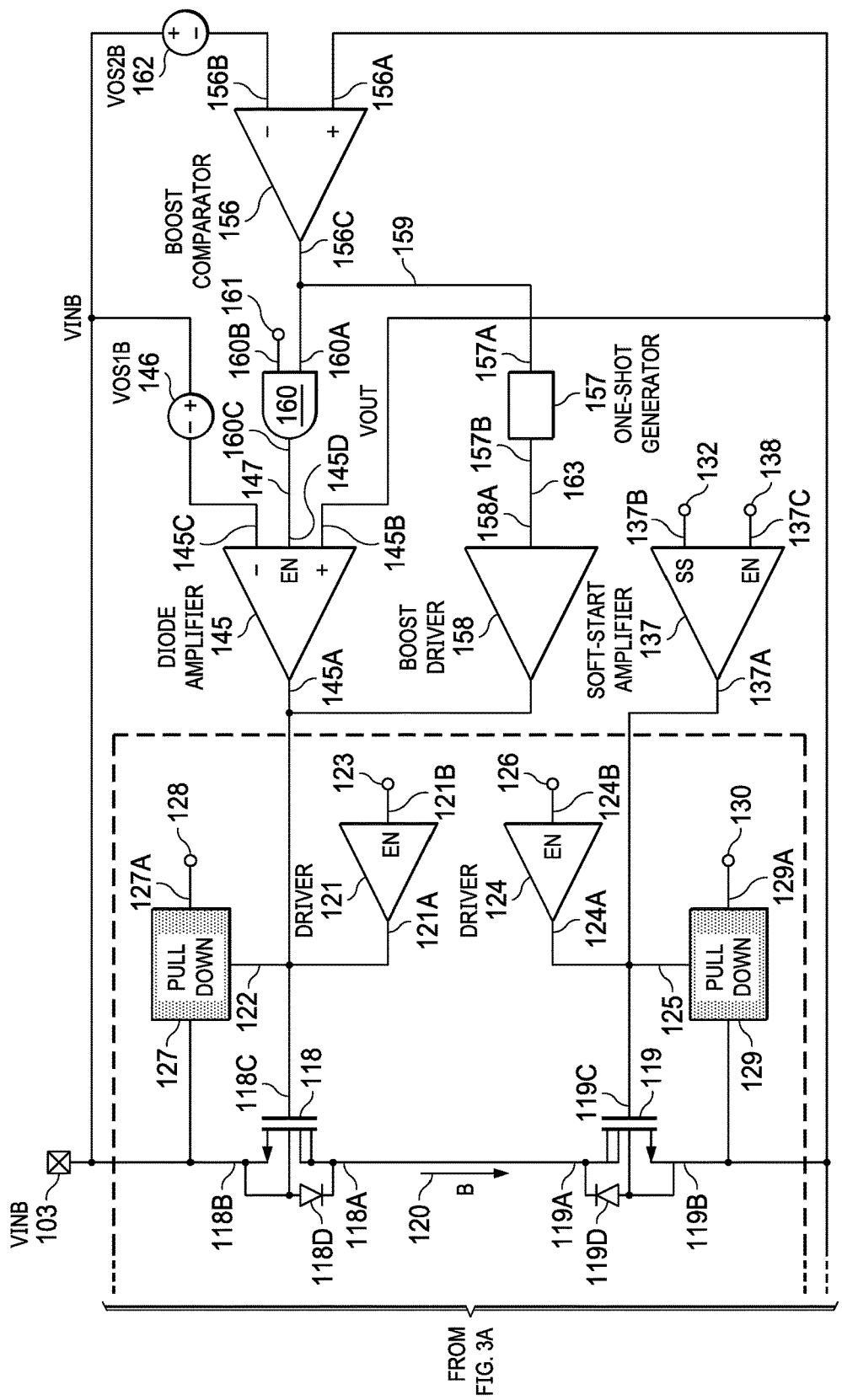
Figure 3C:
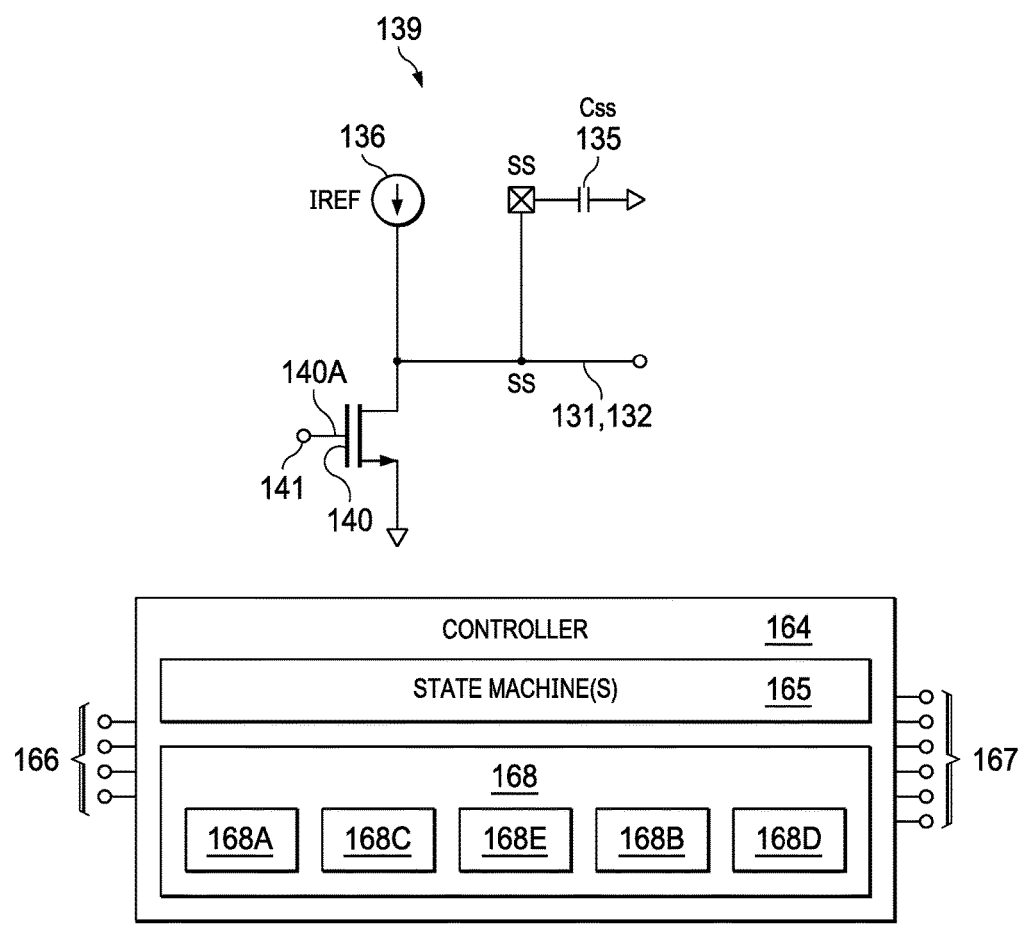

The example state diagram 200 of FIG. 2 will be described with reference to FIGS. 3A-C, 4A-C, 5A-C and 6A-C. FIGS. 3A-C, 4A-C, 5A-C and 6A-C correspond respectively to states 202, 204, 206 and 208 of the state diagram 200 of FIG. 2. FIGS. 3A-C, 4A-C, 5A-C and 6A-C are identical to FIGS. 1A-C except that different components, devices, etc. are cross-hatched to indicate which components, devices, etc. are enabled, active, etc. for the state to which the figure is associated. For example, for the "Channel A On" state 202 in FIG. 2 (which corresponds to FIGS. 3A-C) indicates that the pull-downs 127, 129 are enabled to turn off the Channel B 120. Thus, the pull-downs 127 and 129 are cross-hatched in FIGS. 3A-C. Similarly, the soft-start amplifiers 133 and 137 are disabled in the "Channel A On" state 202 and, thus, are shown in FIGS. 3A-C without cross-hatching. For clarity of illustration, in FIGS. 3A-C, 4A-C, 5A-C and 6A-C only components, devices, etc. that are enabled in a state are shown. All other components, devices, etc. are disabled. If a component, device, etc. is enabled in one state, and the power multiplexer circuit 100 transitions to another state in which the component, device, etc. is disabled, the component, device, etc. is disabled at the state transition.

The example state diagram 200 of FIG. 2 depicts a channel switchover from Channel A 107 (input 102 in FIGS. 1A-C) to Channel B 120 (input 103 in FIGS. 1A-C). Starting with a "Channel A On" state 202 shown in FIGS. 3A-C, the controller 164 enables the pull-down 127 and the pull-down 129 to turn off the MOSFETS 118 and 119 disabling the channel B 120, and enables the drivers 108 and 111 to turn on the MOSFETS 105 and 106, thereby coupling the input 102 to the output 101. All devices associated with switchovers (e.g., the soft-start amplifiers 133 and 137, the diode amplifiers 142 and 145, and the boost comparators 148 and 156) are disabled.

Figure 4A:
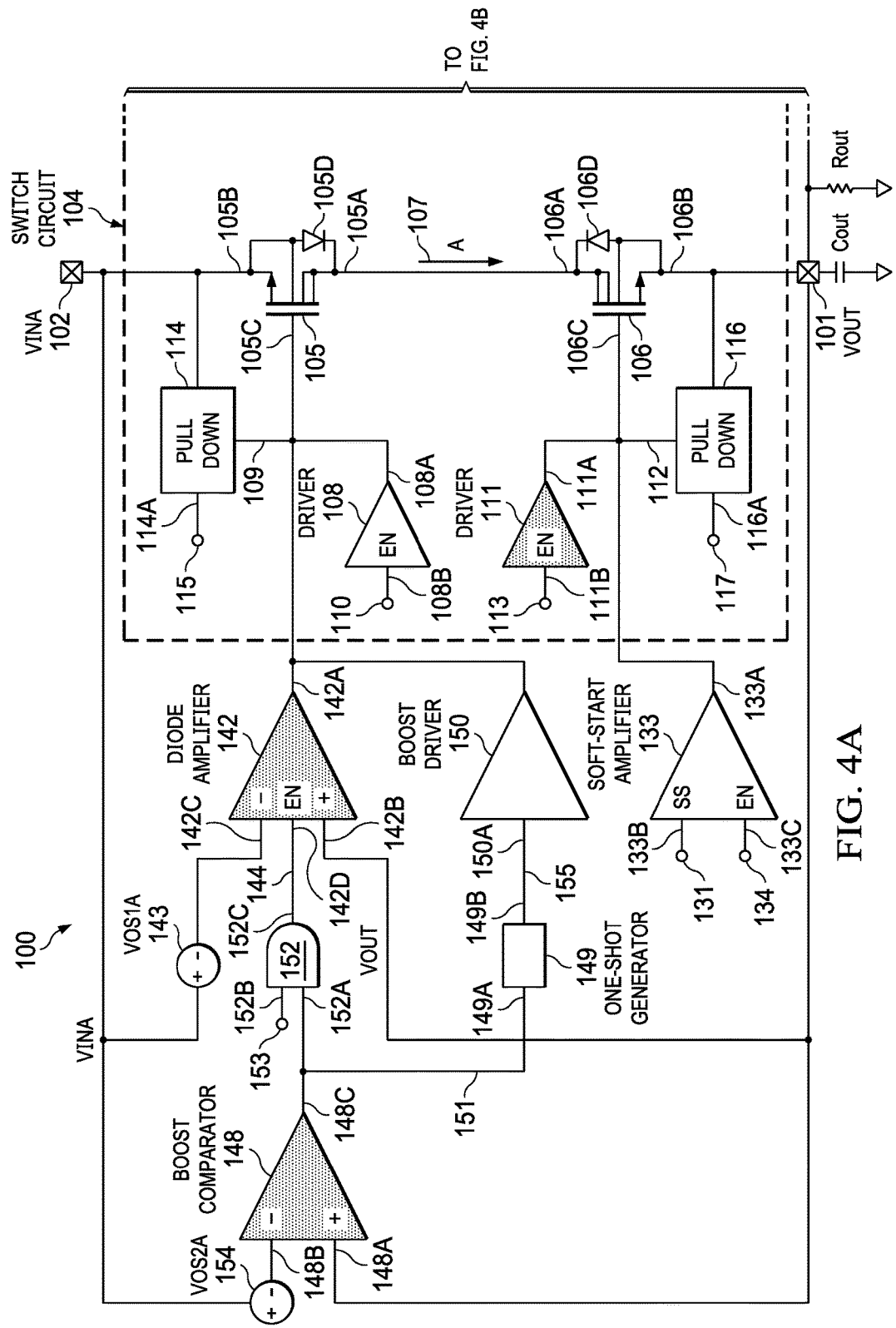
Figure 4B:
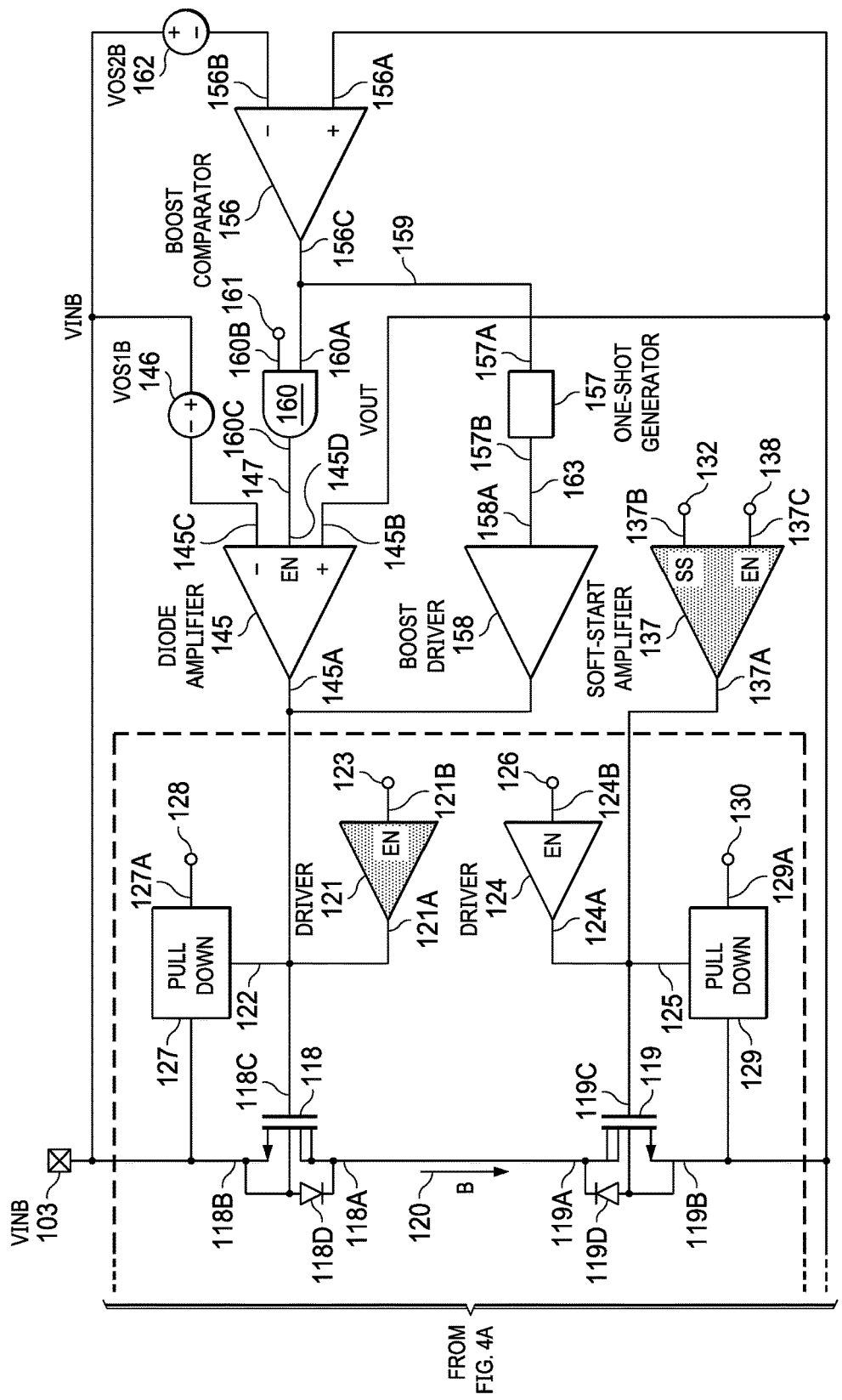
Figure 4C:
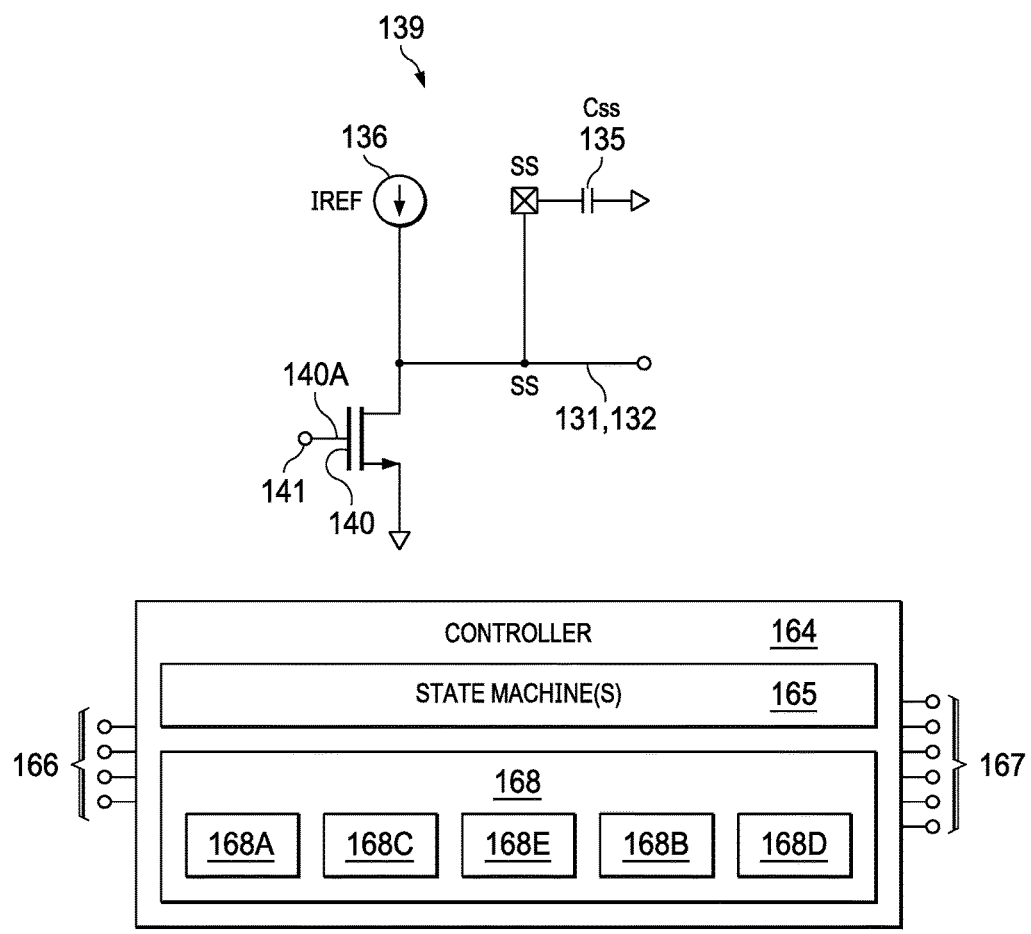

If Channel B 120 is enabled (block 210) and the input voltage VINB at the input 103 is greater than the input voltage VINA at the input 102 (block 212), the controller 164 transitions the power multiplexer circuit 100 to the "Switch Over" state 204 shown in FIGS. 4A-C. In the "Switch Over" state 204, the driver 111, the driver 121, the soft-start amplifier 137, the diode amplifier 142, and the boost comparator 148 are enabled. The drivers 108 and 124 and the pull-downs 127, 114, 116, and 129 are disabled. The soft-start amplifier 137 is enabled to gradually turn on the MOSFET 119, thereby managing (e.g., reducing, limiting, etc.) inrush current. The diode amplifier 142 and the boost comparator 148 are enabled to manage (e.g., reduce, limit, block, etc.) reverse current and/or output voltage drops that can cause circuit damage and/or circuit instabilities. Use of the soft-start amplifier 137, the diode amplifier 142 and the boost comparator 148 allow the power multiplexer circuit 100 to switch to from Channel A to Channel B under a wide range of load conditions and without the undesirable channel switchover behaviors.

An example operation of the power multiplexer circuit 100 of FIGS. 1A-C in the "Switch Over" state 204 is shown in FIG. 7. In the illustrated example of FIG. 7, the power multiplexer circuit 100 is switching from input 102 (VIN1) to input 103 (VIN2). During a phase 702 of the switchover, the soft-start amplifier 137 is enabled while the soft-start voltage on the line 132 is above a reference voltage VREF (see Soft Start B state of FIGS. 8A-B), the diode amplifier 142 is enabled, and the boost comparator 148 monitors the output voltage VOUT at the output 101. During the phase 702, the soft-start amplifier 137 turns off the MOSFET 119 by holding the gate voltage on the gate 119C to be less than VOUT+Vt of MOSFET 119. The soft-start amplifier 137 gradually turns on the MOSFET 119, thereby to manage (e.g., reduce, limit, etc.) inrush current. When, in the illustrated example, the output voltage VOUT at the output 101 falls below VIN1-VOS2 between time t1 and time t2, the boost comparator 148 triggers the one-shot generator 149 and the boost driver 150 to temporarily boost the output voltage VOUT between the time t2 and a falling edge of one-shot signal at a time t3. The diode amplifier 142 is enabled to manage (e.g., reduce, limit, block, etc.) reverse current and/or output voltage drops that can cause circuit damage and/or circuit instabilities. The boost comparator 148 is enabled to detect and limit drops in the output voltage VOUT at the output 101 that may be indicative of an instability associated with the diode amplifier 142. Such instabilities can result from output load conditions. Use of the soft-start amplifier 137, the diode amplifier 142 and the boost comparator 148 allow the power multiplexer circuit 100 to switch from Channel A to Channel B under a wide range of load conditions and without the undesirable channel switchover behaviors.

After the phase 702, the soft-start amplifier 137 increases the gate voltage on the gate 119C to be higher than VOUT+Vt, and increases VOUT at the rate of (IREF/Css)*gain, gradually over time turning on the MOSFET 119, thereby gradually over time increasing the output voltage VOUT at the output 101.

Figure 5A:
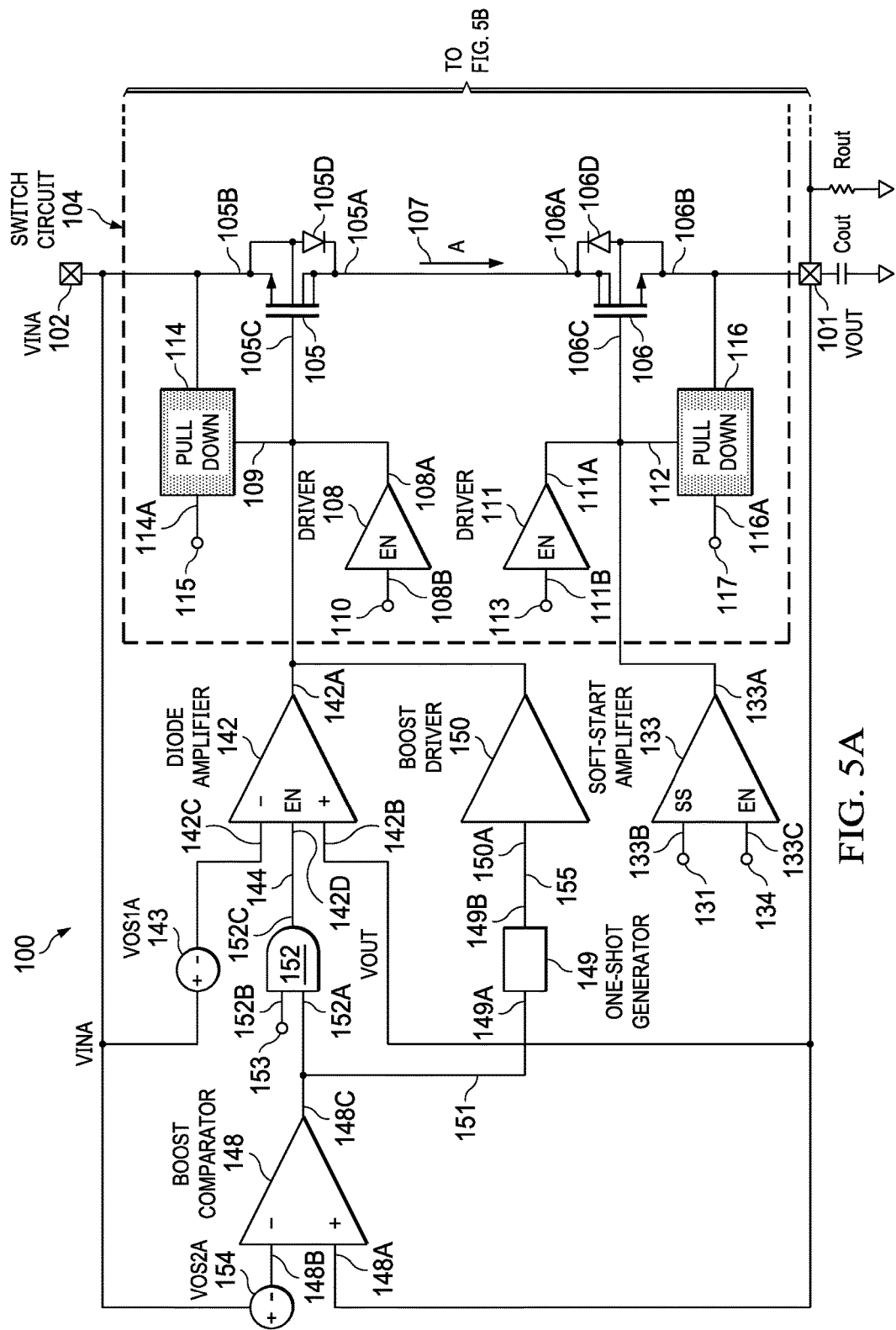
Figure 5B:
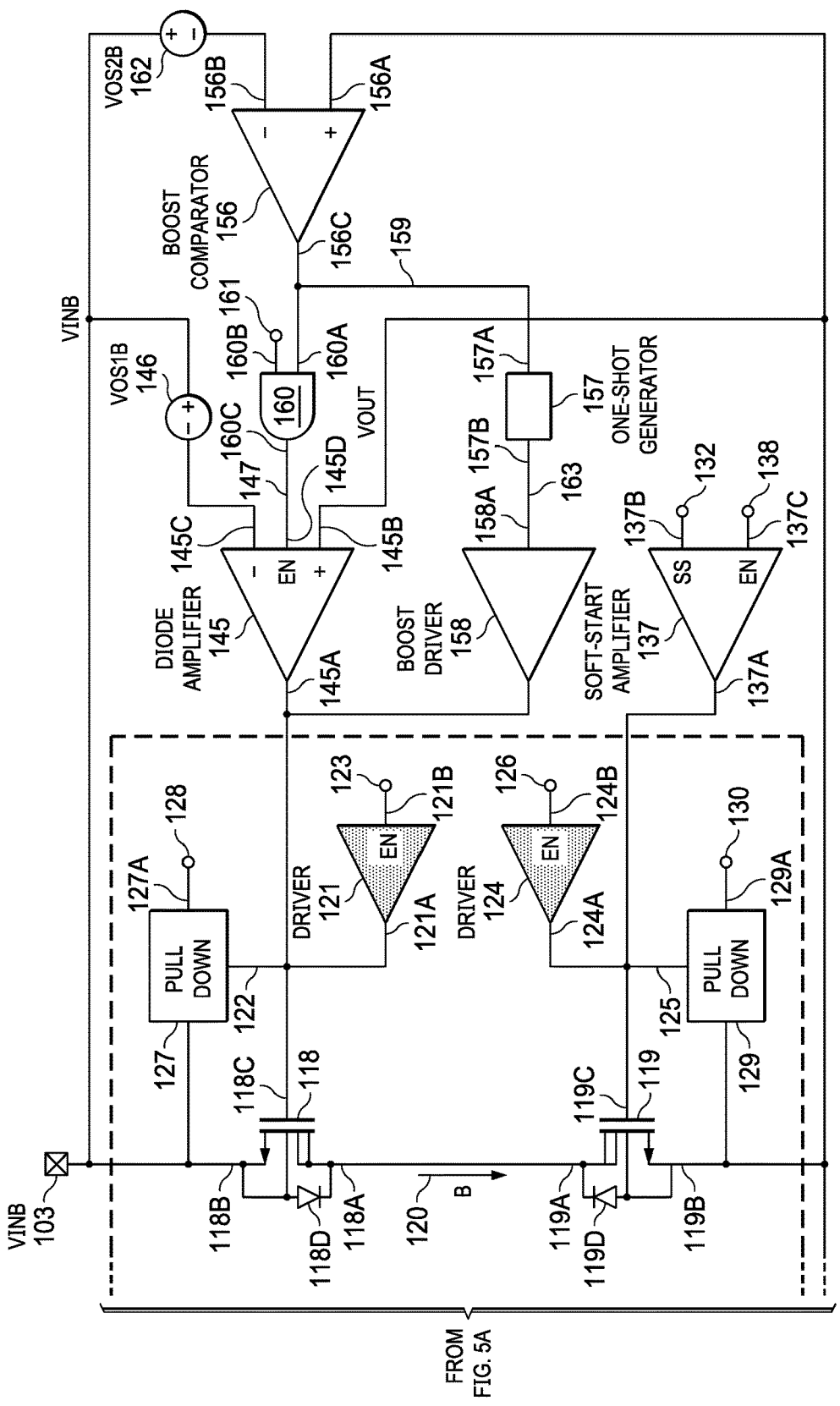

Returning to FIG. 2, when the MOSFET 119 has turned on (block 214), the controller 164 transitions the power multiplexer circuit 100 to the "Channel B On" state 206 shown in FIGS. 5A-C. In some examples, determining when the MOSFET 119 has turned on includes a comparator compares the Vgs voltage between the gate 119C and the source 119B with a reference voltage (e.g., 3V), and/or a comparator comparing Css voltage with a reference voltage (e.g., 4V). In some examples, the reference voltage is selected to turn on the MOSFET 106 and the MOSFET 119 under highest expected VINA and VINB conditions. In the "Channel B On" state 206 of FIGS. 5A-C, the drivers 121 and 124 are enabled to turn on the MOSFETS 118 and 119, respectively, thereby coupling the input 103 to the output 101. The drivers 108 and 111 associated with Channel A 107 are disabled. The pull-down 114 is enabled to turn off the MOSFET 105 and the pull-down 116 is enabled to turn off the MOSFET 106. All devices associated with switchovers (e.g., the soft-start amplifiers 133 and 137, the diode amplifiers 142 and 145, and the boost comparators 148 and 156) are disabled.

Figure 6A:
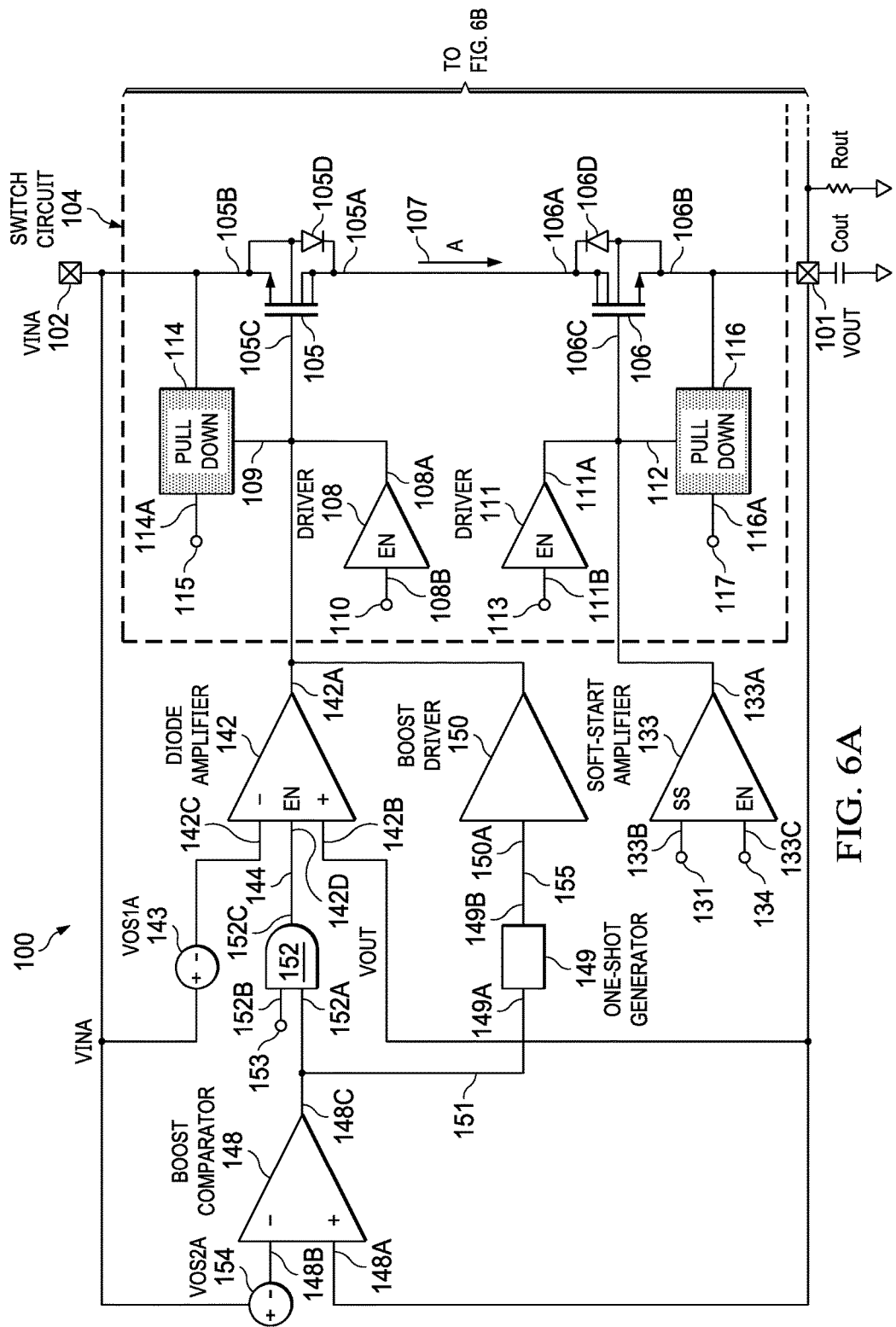
Figure 6B:
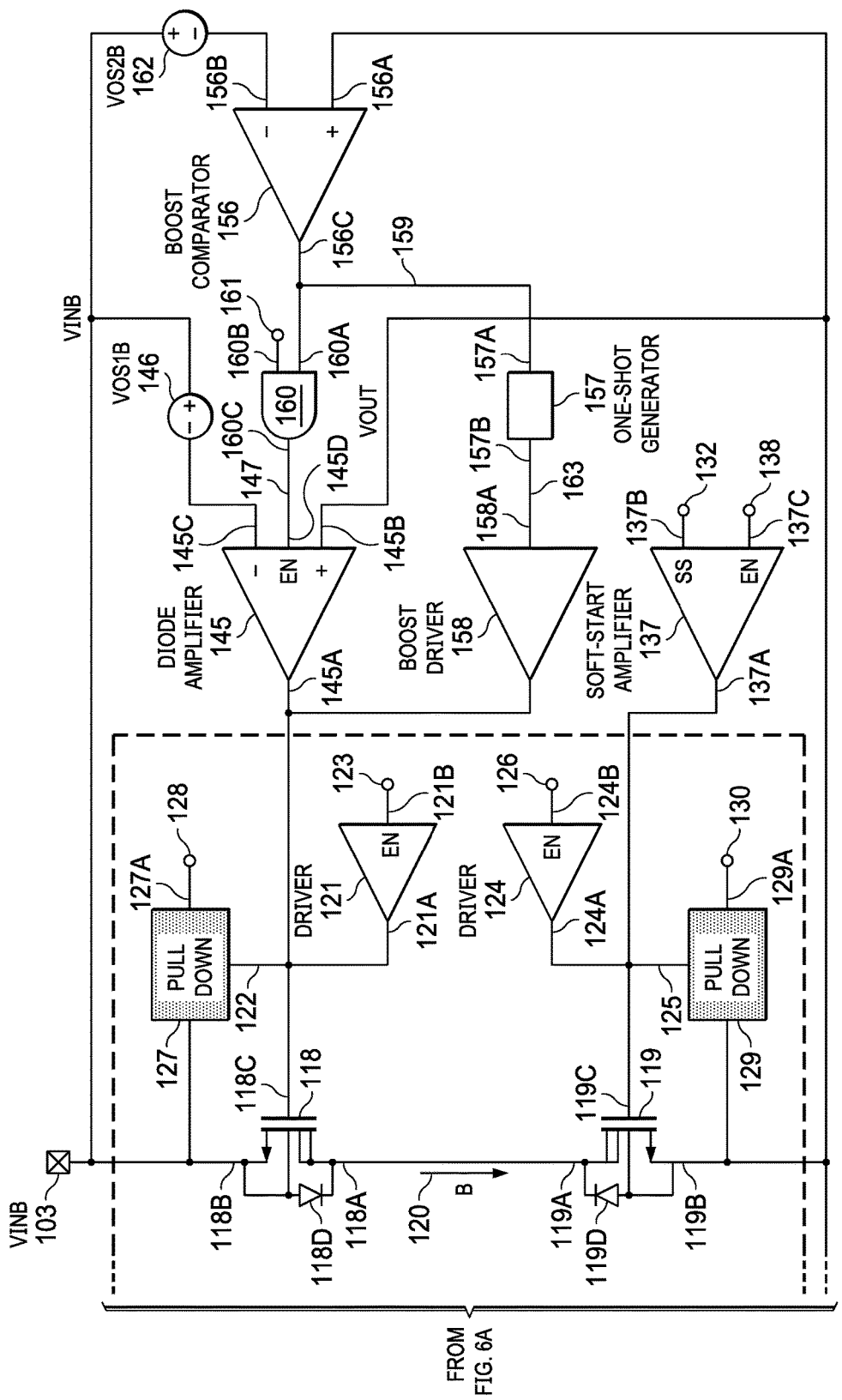

Returning to block 212, if the input voltage VINB at the input 103 is not greater than the input voltage VINA at the input 102 (block 212), the controller transitions the power multiplexer circuit 100 to the "Both Channels Off" state 208 of FIGS. 6A-C. In the "Both Channels Off" state 208, the pull-downs 114, 116, 127 and 129 are enabled, and all other devices, components are disabled, thereby neither the input voltage VINA nor the input voltage VINB are connected to the output 101, thereby discharging VOUT by the Rout (e.g., output loading). VOUT discharges, and when the input voltage VINB at the input 103 is equal or greater than the output voltage VOUT at the output 101 (block 216), the controller 164 transitions the power multiplexer circuit 100 to the "Channel B On" state 206 described above.

FIGS. 8A-B is a state diagram 800 representative of example state machine for operating the example power multiplexer circuit 100 of FIGS. 1A-C. The state diagram 800 may be implemented as hardware logic, machine-readable instructions, hardware implemented state machines, and/or any combination thereof for operating the example power multiplexer circuit 100 of FIGS. 1A-C. The state diagram 800 may be an executable program or portion of an executable program for execution by a processor. The program may be embodied in software (e.g., machine-readable instructions) stored on any number and/or type(s) of non-transitory computer-readable storage device or non-transitory storage disk such as a non-volatile memory (e.g., ROM, EEPROM, flash memory), a volatile memory (e.g., SDRAM, DRAM, RDRAM® and/or any other type of RAM device), etc. The example processor may be, for example, one or more of a programmable processor, a programmable controller, a DSP, an ASIC, an ARM processor, etc. Additionally, and/or alternatively, the state diagram 800 may be implemented by one or more hardware circuits (e.g., discrete and/or integrated analog and/or digital circuitry, a PLD, an FPGA, an ASIC, a comparator, an operational-amplifier (op-amp), a logic circuit, etc.) structured to perform the corresponding operations without executing software or firmware. Although an example state machine is described with reference to the state diagram 800 illustrated in FIGS. 8A-B, many other methods of operating the power multiplexer circuit 100 may alternatively be used. For example, the order of execution of the states may be changed, and/or some of the states described may be changed, eliminated, or combined.

For clarity of illustration, in FIGS. 8A-B only components, devices, etc. that are enabled in a state are shown. All other components, devices, etc. are disabled. If a component, device, etc. is enabled in one state, and the power multiplexer circuit 100 transitions to another state in which the component, device, etc. is disabled, the component, device, etc. is disabled at the state transition.

Starting in a "Gate A Pull-down" state 802, the pull-downs 114, 116, 127, and 129 are closed to prevent input voltage coupling to gate through Cgd parasitic capacitance. When the soft-start signal SS on the line 131 exceeds a reference voltage VREF (block 804), the controller 164 transitions the power multiplexer circuit 100 to a "Soft Start A" state 806.

In the "Soft Start A" state 806, the power multiplexer circuit 100 is in a configuration that turns on channel A 107 by enabling the driver 108, the soft-start amplifier 133, and the pull-downs 127 and 129. When the MOSFET 106 turns on (block 808), the controller 164 transitions the power multiplexer circuit 100 to a "Channel A On" state 810. In the "Channel A On" state 810, the power multiplexer circuit 100 is configured as shown in FIGS. 3A-C. The soft-start amplifier 133 is enabled to gradually turn on the MOSFET 106, thereby managing (e.g., reducing, limiting, etc.) inrush current.

If Channel B 120 is enabled (block 812), and VINB<VINA (block 814), the controller transitions the power multiplexer circuit 100 to a "2 Channels Off" state 816 where the pull-downs 114, 116, 127 and 129 are enabled until VINB≥VOUT (block 818). When VINB≥VOUT (block 818), the controller 164 transitions the power multiplexer circuit 100 to a "Channel B On" state 820. In the "Channel B On" state 820, the power multiplexer circuit 100 is in the configuration shown in FIGS. 5A-C.

Returning to block 814, if VINB>VINA (block 814), the controller 164 transitions the power multiplexer circuit 100 to a "Gate B Pull-down" state 822. Because in the "Gate B Pull-down" state 822 the channel A 107 was previously turned on, in state 822 the drivers 108, 111 are enabled to keep Channel A on while the pull-downs 127 and 129 are enabled to remove parasitic coupling from the input VINB. When the soft-start signal SS on the line 131, 132 exceeds a reference voltage VREF (block 824), the controller 164 transitions the power multiplexer circuit 100 to a "Soft Start B" state 826.

In the "Soft Start B" state 826, the power multiplexer circuit 100 is in the configuration shown in FIGS. 4A-C. In the "Soft Start B" state 826, the soft-start amplifier 137 is enabled to gradually turn on the MOSFET 119, thereby to manage (e.g., reduce, limit, etc.) inrush current. The diode amplifier 142 is enabled to manage (e.g., reduce, limit, block, etc.) reverse current and/or output voltage drops that can cause circuit damage and/or circuit instabilities. The boost comparator 148 is enabled to detect and limit drops in the output voltage VOUT at the output 101 that may be indicative of an instability associated with the diode amplifier 142. Such instabilities can result from output load conditions. Use of the soft-start amplifier 137, the diode amplifier 142 and the boost comparator 148 allow the power multiplexer circuit 100 to switch from Channel A to Channel B under a wide range of load conditions and without the undesirable channel switchover behaviors.

When the MOSFET 119 turns on (block 828), the controller 164 transitions the power multiplexer circuit 100 to the "Channel B On" state 820, shown in FIGS. 5A-C.

While an example power multiplexer circuit 100 is shown in FIGS. 1A-C, a power multiplexer can include additional circuitry and/or may exclude some of the circuitry shown in FIGS. 1A-C. For example, if output Cout and Rout conditions are restricted, then the boost comparator 148, the one-shot generator 149, and the boost driver 150 may not be needed for diode amplifier 142 stability.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

Example channel switchover power multiplexer circuits, and methods of operating the same are disclosed herein. Further examples and combinations thereof include at least the following.

Example 1 is a power multiplexer including a first transistor coupled to a first input, a second transistor coupled to the first transistor to selectively couple a first voltage at the first input to an output, a third transistor coupled to a second input, a fourth transistor coupled to the third transistor to couple a second voltage at the second input to the output, a diode amplifier to selectively provide a third voltage to a gate of the first transistor to block a reverse current, and a soft-start amplifier to provide a fourth voltage to a gate of the fourth transistor to turn on the fourth transistor with a constant ramp rate.

Example 2 is the power multiplexer of example 1, further including a comparator to, while the diode amplifier provides the third voltage to the gate of the first transistor, detect a drop in a fifth voltage at the output, and a one-shot generator to, while the diode amplifier provides the third voltage to the gate of the first transistor, form a pulse to temporarily turn on the first transistor.

Example 3 is the power multiplexer of example 1, wherein the first transistor is connected to the second transistor to pass current bidirectionally between the first input and the output.

Example 4 is the power multiplexer of example 1, further including a second soft-start amplifier to provide a fifth voltage to a gate of the second transistor to turn on the second transistor with a constant ramp rate, and a capacitor coupled to a ground, and coupled to an input of the soft-start amplifier and an input of the second soft-start amplifier.

Example 5 is the power multiplexer of example 1, further including a controller to switch the power multiplexer from (a) a first state wherein the first voltage at the first input coupled to the output to (b) a second state wherein the second voltage at the second input coupled to the output by enabling the diode amplifier, and enabling the soft-start amplifier.

Example 6 is the power multiplexer of example 5, where the controller is to disable the diode amplifier, and disable the soft-start amplifier.

Example 7 is the power multiplexer of example 6, further including a second diode amplifier to provide a fifth voltage to a gate of the third transistor to block a reverse current, and a second soft-start amplifier to provide a sixth voltage to a gate of the second transistor to turn on the second transistor with a constant ramp rate, wherein the controller is to switch the power multiplexer from the first state to the second state by enabling the second diode amplifier, and enabling the second soft-start amplifier.

Example 8 is the power multiplexer of example 1, further including a first driver coupled to a gate of the first transistor, a second driver coupled to a gate of the second transistor, a first pull-down coupled to the gate of the second transistor, a third driver coupled to a gate of the third transistor, a fourth driver coupled to the gate of the fourth transistor, a second pull-down coupled to the gate of the fourth transistor, and a controller to:

in a first state, enable the first driver, enable the second driver, disable the third driver, disable the fourth driver, disable the soft-start amplifier, disable the second diode amplifier, disable the first pull-down, and enable the second pull-down to couple the first voltage at the first input to the output;

in a second state, disable the first driver, disable the second driver, enable the third driver, enable the fourth driver, disable the soft-start amplifier, disable the diode amplifier, enable the first pull-down, and disable the second pull-down to couple the second voltage at the second input to the output; and transition the power multiplexer from the first state to the second state by disabling the first pull-down, enabling the diode amplifier, enabling the soft-start amplifier, disabling the first driver, enabling the second driver, enabling the third driver, and disabling the fourth driver.

Example 9 is a method of controlling a power multiplexer circuit including enabling a soft-start amplifier to turn on the second transistor, the second transistor having a drain connected to a drain of the first transistor to form a first channel between a first input and an output, enabling a diode amplifier to regulate a gate voltage of a third transistor, the third transistor having a drain connected to a drain of a fourth transistor to form a second channel between a second input and an output, and, when the first transistor has turned on, disabling the soft-start amplifier, enabling a first driver to hold the first transistor on, and disabling the diode amplifier.

Example 10 is the method of controlling the power multiplexer circuit of example 9, further including enabling a second driver to hold the second transistor on when the soft-start amplifier is enabled.

Example 11 is the method of controlling the power multiplexer circuit of example 9, when an output voltage at the output satisfies a threshold, disabling the diode amplifier, and enabling a boost driver to form a pulsed gate voltage for the third transistor.

Example 12 is the method of controlling the power multiplexer circuit of example 9, further including when the first transistor has turned on, enabling a pull-down to disable the third transistor and the fourth transistor.

Example 13 is the method of controlling the power multiplexer circuit of example 9, wherein the diode amplifier regulates the gate voltage of the third transistor based on a comparison of an output voltage at the output and an input voltage.

Example 14 is the method of controlling the power multiplexer circuit of example 9, further including charging and discharging a capacitor to generate an input for the soft-start amplifier.

Example 15 is a power multiplexer circuit including, a first transistor having a source coupled to a first power multiplexer input, a second transistor having a drain coupled to a drain of the first transistor, and a source coupled to a power multiplexer output, a third transistor having a source coupled to a second power supply input, a fourth transistor having a drain coupled to a drain of the third transistor, and a source coupled to the power multiplexer input, a first amplifier having an output coupled to a gate of the first transistor, a first input coupled to the first power multiplexer input via a first voltage source, and a second input coupled to the power multiplexer output, a second amplifier having an output coupled to a gate of the fourth transistor, a capacitor having a first terminal coupled to an input of the second amplifier and to a charging source, and a controller coupled to an enable input of the first amplifier and to an enable input of the second amplifier.

Example 16 is the power multiplexer circuit of example 15, wherein the first transistor is a first metal-oxide semiconductor field-effect transistor (MOSFET), the second transistor is a second MOSFET, the third transistor is a third MOSFET, and the fourth transistor is a fourth MOSFET.

Example 17 is the power multiplexer circuit of example 16, further including a comparator having a first input coupled to the power multiplexer output, a second input coupled to the first power multiplexer input via a second voltage source, and an output; and a logic gate having a first input coupled to the output of the comparator, an enable input coupled to the controller, and an output coupled to an enable input of the first amplifier.

Example 18 is the power multiplexer circuit of example 17, further including a pulse generator having an input coupled to the output of the comparator, and a driver having an input coupled to an output of the pulse generator, and an output coupled to the gate of the first MOSFET.

Example 19 is the power multiplexer circuit of example 18, further including a first driver having an output coupled to the gate of the first MOSFET, a second driver having an output coupled to a gate of the second MOSFET, a third driver having an output coupled to a gate of the third MOSFET, a fourth driver having an output coupled to the gate of the fourth MOSFET, a first pull-down having an output coupled to the gate of the second MOSFET, and a second pull-down having an output coupled to the gate of the fourth MOSFET.

Any references, including publications, patent applications, and patents cited herein are hereby incorporated in their entirety by reference to the same extent as if each reference were individually and specifically indicated to be incorporated by reference and were set forth in its entirety herein.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A power multiplexer, comprising:
a first transistor coupled to a first input;
a second transistor coupled to the first transistor to selectively couple a first voltage at the first input to an output;
a third transistor coupled to a second input;
a fourth transistor coupled to the third transistor to selectively couple a second voltage at the second input to the output;
a diode amplifier to provide a third voltage to a gate of the first transistor to block a reverse current; and
a soft-start amplifier to provide a fourth voltage to a gate of the fourth transistor to turn on the fourth transistor with a constant ramp rate.

2. The power multiplexer of claim 1, further including:
a comparator to, while the diode amplifier provides the third voltage to the gate of the first transistor, detect a drop in a fifth voltage at the output; and
a one-shot generator to, while the diode amplifier provides the third voltage to the gate of the first transistor, form a pulse to temporarily turn on the first transistor.

3. The power multiplexer of claim 1, wherein the first transistor is connected to the second transistor to pass current bidirectionally between the first input and the output.

4. The power multiplexer of claim 1, further including:
a second soft-start amplifier to provide a fifth voltage to a gate of the second transistor to turn on the second transistor with a constant ramp rate; and
a capacitor coupled to a ground, and coupled to an input of the soft-start amplifier and an input of the second soft-start amplifier.

5. The power multiplexer of claim 1, further including a controller to switch the power multiplexer from (a) a first state wherein the first voltage at the first input coupled to the output to (b) a second state wherein the second voltage at the second input coupled to the output by:
enabling the diode amplifier, and
enabling the soft-start amplifier.

6. The power multiplexer of claim 5, where the controller is to:
disable the diode amplifier; and
disable the soft-start amplifier.

7. The power multiplexer of claim 6, further including:
a second diode amplifier to provide a fifth voltage to a gate of the third transistor to block a reverse current; and
a second soft-start amplifier to provide a sixth voltage to a gate of the second transistor to turn on the second transistor with a constant ramp rate,
wherein the controller is to switch the power multiplexer from the first state to the second state by:
enabling the second diode amplifier, and
enabling the second soft-start amplifier.

8. The power multiplexer of claim 1, further including:
a first driver coupled to a gate of the first transistor;
a second driver coupled to a gate of the second transistor;
a first pull-down coupled to the gate of the second transistor;
a third driver coupled to a gate of the third transistor;
a fourth driver coupled to the gate of the fourth transistor;
a second pull-down coupled to the gate of the fourth transistor; and
a controller to:
in a first state, enable the first driver, enable the second driver, disable the third driver, disable the fourth driver, disable the soft-start amplifier, disable the diode amplifier, disable the first pull-down, and enable the second pull-down to couple the first voltage at the first input to the output;
in a second state, disable the first driver, disable the second driver, enable the third driver, enable the fourth driver, disable the soft-start amplifier, disable the diode amplifier, enable the first pull-down, and disable the second pull-down to couple the second voltage at the second input to the output; and
transition the power multiplexer from the first state to the second state by disabling the first pull-down, disabling the second pull-down, enabling the diode amplifier, enabling the soft-start amplifier, disabling the first driver, enabling the second driver, enabling the third driver, and disabling the fourth driver.

9. A method of controlling a power multiplexer circuit, the method comprising:
enabling a soft-start amplifier to turn on a first transistor, the first transistor having a drain connected to a drain of a second transistor to form a first channel between a first input and an output;

enabling a diode amplifier to regulate a gate voltage of a third transistor, the third transistor having a drain connected to a drain of a fourth transistor to form a second channel between a second input and an output; and when the first transistor has turned on:
    disabling the soft-start amplifier,
    enabling a first driver to hold the first transistor on, and
    disabling the diode amplifier.

10. The method of controlling the power multiplexer circuit of claim 9, further including enabling a second driver to hold the second transistor on when the soft-start amplifier is enabled.

11. The method of controlling the power multiplexer circuit of claim 9, when an output voltage at the output satisfies a threshold, disabling the diode amplifier, and enabling a boost driver to form a pulsed gate voltage for the third transistor.

12. The method of controlling the power multiplexer circuit of claim 9, further including when the first transistor has turned on, enabling a pull-down to disable the third transistor and the fourth transistor.

13. The method of controlling the power multiplexer circuit of claim 9, wherein the diode amplifier regulates the gate voltage of the third transistor based on a comparison of an output voltage at the output and an input voltage.

14. The method of controlling the power multiplexer circuit of claim 9, further including charging and discharging a capacitor to generate an input for the soft-start amplifier.

15. A power multiplexer circuit, comprising:
    a first transistor having a source coupled to a first power multiplexer input;
    a second transistor having a drain coupled to a drain of the first transistor, and a source coupled to a power multiplexer output;
    a third transistor having a source coupled to a second power supply input;
    a fourth transistor having a drain coupled to a drain of the third transistor, and a source coupled to the power multiplexer input;
    a first amplifier having an output coupled to a gate of the first transistor, a first input coupled to the first power multiplexer input via a first voltage source, and a second input coupled to the power multiplexer output;
    a second amplifier having an output coupled to a gate of the fourth transistor;
    a capacitor having a first terminal coupled to an input of the second amplifier and to a charging source; and
    a controller coupled to an enable input of the first amplifier and to an enable input of the second amplifier.

16. The power multiplexer circuit of claim 15, wherein the first transistor is a first metal-oxide semiconductor field-effect transistor (MOSFET), the second transistor is a second MOSFET, the third transistor is a third MOSFET, and the fourth transistor is a fourth MOSFET.

17. The power multiplexer circuit of claim 16, further including:
    a comparator having a first input coupled to the power multiplexer output, a second input coupled to the first power multiplexer input via a second voltage source, and an output; and
    a logic gate having a first input coupled to the output of the comparator, an enable input coupled to the controller, and an output coupled to an enable input of the first amplifier.

18. The power multiplexer circuit of claim 17, further including:
    a pulse generator having an input coupled to the output of the comparator; and
    a driver having an input coupled to an output of the pulse generator, and an output coupled to the gate of the first MOSFET.

19. The power multiplexer circuit of claim 18, further including:
    a first driver having an output coupled to the gate of the first MOSFET;
    a second driver having an output coupled to a gate of the second MOSFET;
    a third driver having an output coupled to a gate of the third MOSFET;
    a fourth driver having an output coupled to the gate of the fourth MOSFET;
    a first pull-down having an output coupled to the gate of the second MOSFET; and
    a second pull-down having an output coupled to the gate of the fourth MOSFET.

* * * * *